(12) United States Patent
Tanaka et al.

(10) Patent No.: US 9,195,069 B2
(45) Date of Patent: Nov. 24, 2015

(54) ILLUMINATION OPTICAL APPARATUS, EXPOSURE APPARATUS, AND DEVICE MANUFACTURING METHOD

(75) Inventors: Hirohisa Tanaka, Kumagaya (JP); Hideki Komatsuda, Ageo (JP)

(73) Assignee: NIKON CORPORATION, Tokyo (JP)

( * ) Notice: Subject to any disclaimer, the term of this patent is extended or adjusted under 35 U.S.C. 154(b) by 482 days.

(21) Appl. No.: 11/783,561

(22) Filed: Apr. 10, 2007

(65) Prior Publication Data

US 2007/0258077 A1  Nov. 8, 2007

Related U.S. Application Data

(60) Provisional application No. 60/897,874, filed on Jan. 29, 2007.

(30) Foreign Application Priority Data

Apr. 17, 2006  (JP) ................................ P2006-112883

(51) Int. Cl.
  *G03B 27/54* (2006.01)
  *G03B 27/44* (2006.01)
  (Continued)

(52) U.S. Cl.
  CPC ........ *G02B 27/0905* (2013.01); *G02B 27/0961* (2013.01); *G02B 27/0972* (2013.01); *G03F 7/70108* (2013.01); *G03F 7/70208* (2013.01); *G03F 7/70275* (2013.01); *G03F 7/70283* (2013.01)

(58) Field of Classification Search
  CPC .............. G03F 7/0083; G03F 7/70091; G03F 7/70108; G03F 7/70158; G03F 7/70208; G03F 7/70275; G03F 7/70283; G02B 27/0905; G02B 27/0961; G02B 27/9072
  USPC ................. 355/40, 46, 67–71, 52, 53–55, 77; 359/624, 621, 639, 640, 583, 618, 619, 359/629, 636–638; 353/82, 34; 250/492.1, 250/492.2, 492.22, 548
  See application file for complete search history.

(56) References Cited

U.S. PATENT DOCUMENTS 3,656,849 A  4/1972  Lu
3,718,396 A  2/1973  Hennings
(Continued)

FOREIGN PATENT DOCUMENTS

EP  1 168 082 A2  1/2002
EP  1 168 083 A2  1/2002
(Continued)

OTHER PUBLICATIONS

Office Action issued in U.S. Appl. No. 11/783,557; Oct. 26, 2009.
(Continued)

*Primary Examiner* — Christina Riddle
(74) *Attorney, Agent, or Firm* — Oliff PLC

(57) ABSTRACT

An illumination optical apparatus has a beam splitting member which splits an incident beam into a first light beam and a second light beam to form a first illumination region and a second illumination region, a first light-guide optical system which guides the first light beam to the first illumination region, and a second light-guide optical system which guides the second light beam to the second illumination region locate apart from the first illumination region.

45 Claims, 27 Drawing Sheets

(51) Int. Cl.
*G03B 27/72* (2006.01)
*G03B 27/32* (2006.01)
*G02B 27/09* (2006.01)
*G03F 7/20* (2006.01)
G03B 27/68 (2006.01)
G03B 27/42 (2006.01)
G03B 27/52 (2006.01)

(56) References Cited

U.S. PATENT DOCUMENTS

| | | |
|---|---|---|
| 4,937,459 A | 6/1990 | Ina |
| 5,005,969 A * | 4/1991 | Kataoka .................. 353/122 |
| 5,035,486 A * | 7/1991 | Inokuchi .................. 359/625 |
| 5,097,291 A * | 3/1992 | Suzuki ..................... 355/69 |
| 5,168,401 A * | 12/1992 | Endriz .................... 359/625 |
| 5,298,365 A | 3/1994 | Okamoto et al. |
| 5,305,054 A * | 4/1994 | Suzuki et al. .............. 355/53 |
| 5,329,335 A | 7/1994 | Wada et al. |
| 5,357,311 A | 10/1994 | Shiraishi |
| 5,369,464 A | 11/1994 | Kamon |
| 5,499,137 A * | 3/1996 | Shiraishi .................. 359/564 |
| 5,530,518 A | 6/1996 | Ushida et al. |
| 5,579,147 A | 11/1996 | Mori et al. |
| 5,673,103 A | 9/1997 | Inoue et al. |
| 5,703,675 A | 12/1997 | Hirukawa et al. |
| 5,724,122 A | 3/1998 | Oskotsky |
| 5,863,677 A | 1/1999 | Nakao |
| 6,249,382 B1 | 6/2001 | Komatsuda |
| 6,351,305 B1 * | 2/2002 | Tanaka et al. ............. 355/77 |
| 6,377,336 B1 * | 4/2002 | Shiraishi et al. .......... 355/67 |
| 6,383,940 B1 | 5/2002 | Yoshimura |
| 6,392,800 B2 * | 5/2002 | Schuster .................. 359/485 |
| 6,512,573 B2 | 1/2003 | Furter |
| 6,535,273 B1 * | 3/2003 | Maul ....................... 355/67 |
| 6,611,316 B2 | 8/2003 | Sewell |
| 6,628,372 B2 | 9/2003 | McCullough et al. |
| 6,724,530 B2 * | 4/2004 | Suzuki et al. ............ 359/485.04 |
| 6,741,394 B1 | 5/2004 | Tanitsu et al. |
| 6,765,647 B1 * | 7/2004 | Nishi ....................... 355/55 |
| 6,778,257 B2 | 8/2004 | Bleeker et al. |
| 6,795,168 B2 * | 9/2004 | Wang et al. .............. 355/67 |
| 6,819,405 B2 | 11/2004 | Mulkens et al. |
| 6,903,801 B2 * | 6/2005 | Mori ........................ 355/67 |
| 6,913,373 B2 | 7/2005 | Tanaka et al. |
| 6,934,009 B2 | 8/2005 | Terashi |
| 7,023,525 B2 | 4/2006 | Bleeker et al. |
| 7,094,506 B2 | 8/2006 | Van Buel |
| 2001/0019404 A1 * | 9/2001 | Schuster et al. .......... 355/67 |
| 2001/0052968 A1 * | 12/2001 | Shiozawa ................. 355/53 |
| 2002/0085276 A1 * | 7/2002 | Tanitsu et al. ............ 359/432 |
| 2002/0123012 A1 | 9/2002 | Sewell |
| 2002/0196629 A1 | 12/2002 | Terashi |
| 2003/0030781 A1 * | 2/2003 | Bleeker et al. ............ 355/67 |
| 2004/0104359 A1 | 6/2004 | Komatsuda et al. |
| 2004/0263816 A1 | 12/2004 | Van Dam |
| 2004/0263817 A1 | 12/2004 | Tanitsu et al. |
| 2005/0030514 A1 | 2/2005 | McCullough et al. |
| 2005/0046816 A1 | 3/2005 | Lin |
| 2005/0213070 A1 | 9/2005 | Scharnweber |
| 2006/0012769 A1 | 1/2006 | Suzuki |
| 2006/0055834 A1 * | 3/2006 | Tanitsu et al. ............ 349/5 |
| 2006/0158624 A1 | 7/2006 | Toyoda |
| 2006/0170901 A1 | 8/2006 | Tanitsu et al. |
| 2006/0171138 A1 | 8/2006 | Muramatsu et al. |
| 2006/0221453 A1 | 10/2006 | Koehler et al. |
| 2007/0013884 A1 | 1/2007 | Kim |
| 2007/0013885 A1 | 1/2007 | Loopstra et al. |
| 2007/0013890 A1 | 1/2007 | Loopstra et al. |
| 2007/0013893 A1 | 1/2007 | Loopstra |
| 2007/0013894 A1 | 1/2007 | Loopstra |
| 2007/0014112 A1 | 1/2007 | Ohya et al. |
| 2007/0146676 A1 * | 6/2007 | Tanitsu et al. ............ 355/71 |
| 2007/0153247 A1 | 7/2007 | Nagasaka |
| 2007/0216884 A1 | 9/2007 | Nagasaka |
| 2007/0242244 A1 | 10/2007 | Nagasaka |
| 2007/0242249 A1 * | 10/2007 | Shibazaki et al. .......... 355/55 |
| 2007/0242254 A1 | 10/2007 | Nagasaka |
| 2007/0242255 A1 | 10/2007 | Nagasaka |
| 2007/0273854 A1 | 11/2007 | Nagasaka |
| 2007/0273858 A1 | 11/2007 | Nagasaka |
| 2007/0279606 A1 | 12/2007 | Nagasaka |
| 2008/0013062 A1 | 1/2008 | Nagasaka |
| 2008/0013065 A1 * | 1/2008 | Kohl ........................ 355/67 |
| 2008/0074631 A1 | 3/2008 | Kita |
| 2008/0246932 A1 | 10/2008 | Shigematsu |
| 2008/0259440 A1 | 10/2008 | Omura |
| 2009/0040490 A1 | 2/2009 | Shigematsu et al. |
| 2009/0135397 A1 * | 5/2009 | Fiolka ...................... 355/71 |
| 2009/0153819 A1 | 6/2009 | Okita |

FOREIGN PATENT DOCUMENTS

| | | |
|---|---|---|
| EP | 1 503 403 A1 | 2/2005 |
| JP | A-2006-013449 | 1/1986 |
| JP | A-61-134022 | 6/1986 |
| JP | A-5-241324 | 9/1993 |
| JP | A-06-053120 | 2/1994 |
| JP | A-6-124873 | 5/1994 |
| JP | A-07-066121 | 3/1995 |
| JP | A-07-142338 | 6/1995 |
| JP | A-07-201723 | 8/1995 |
| JP | A-8-313842 | 11/1996 |
| JP | A-10-303114 | 11/1998 |
| JP | A-11-111601 | 4/1999 |
| JP | A-11-274069 | 10/1999 |
| JP | A-2000-021742 | 1/2000 |
| JP | A 2000-21742 | 1/2000 |
| JP | A-2000-21748 | 1/2000 |
| JP | A 2000-021748 | 1/2000 |
| JP | A-2000-31028 | 1/2000 |
| JP | A-2001-110707 | 4/2001 |
| JP | A-2001-135560 | 5/2001 |
| JP | A 2001-297976 | 10/2001 |
| JP | A-2002-064058 | 2/2002 |
| JP | A-2002-231619 | 8/2002 |
| JP | A-2002-359176 | 12/2002 |
| JP | A-2003-142379 | 5/2003 |
| JP | A-2004-519850 | 7/2004 |
| JP | A-2004-304135 | 10/2004 |
| JP | A-2005-005521 | 1/2005 |
| JP | A-2005-166871 | 6/2005 |
| JP | A-2005-236088 | 9/2005 |
| WO | WO 99/49504 A1 | 9/1999 |
| WO | WO 2004/019128 A2 | 3/2004 |
| WO | WO 2005/026822 A2 | 3/2005 |
| WO | WO 2005071718 A1 * | 8/2005 |
| WO | WO 2006/059549 A1 | 6/2006 |

OTHER PUBLICATIONS

Office Action issued in U.S. Appl. No. 11/783,558; Nov. 17, 2009.
Search Report issued Mar. 9, 2011 in European Patent Application No. 07739716.4.
Jul. 13, 2012 Office Action issued in Japanese Patent Application No. P2008-510853 (with translation).
Sep. 20, 2012 Office Action issued in Japanese Patent Application No. P2008-510853 (with translation).
English translation of Apr. 9, 2013 Office Action issued in Korean Patent Application No. 2008-7017098.
English translation of Aug. 16, 2013 Office Action issued in Taiwanese Patent Application No. 096111592.
English translation of Jun. 12, 2013 Search Report issued in Taiwanese Patent Application No. 096111592.

* cited by examiner

Fig.4
(a)
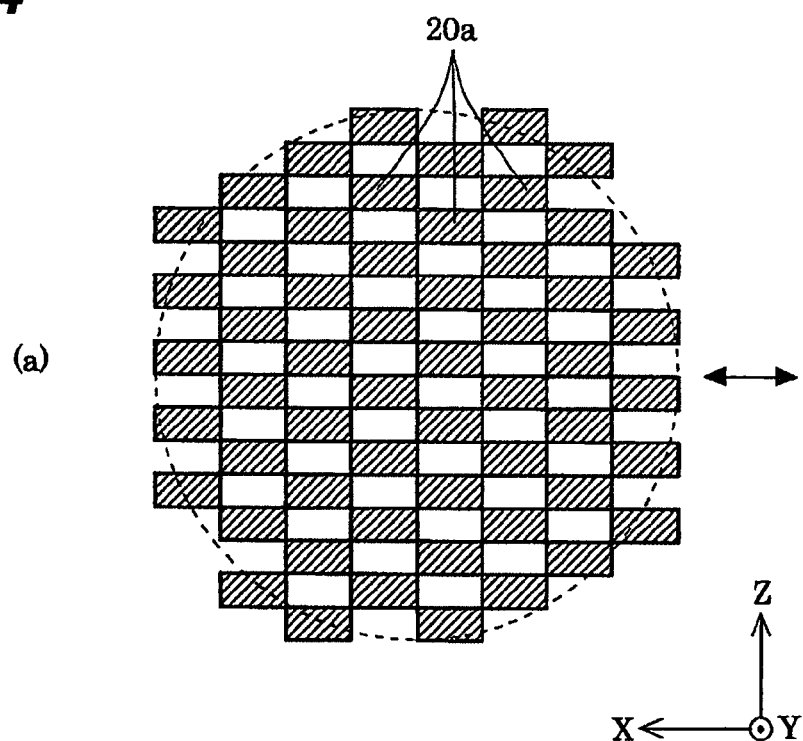
(b)
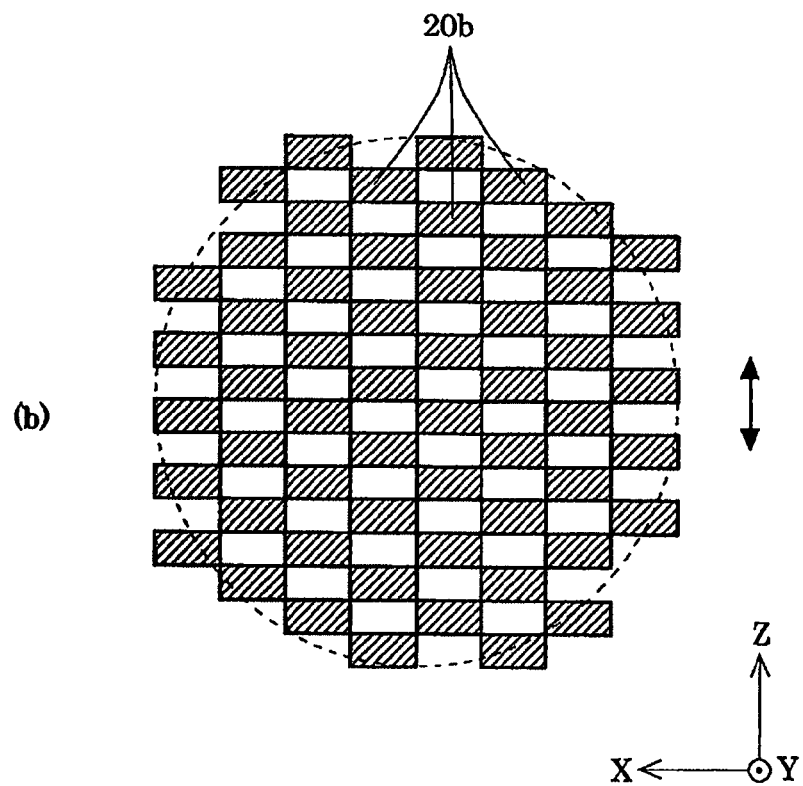

Fig.5
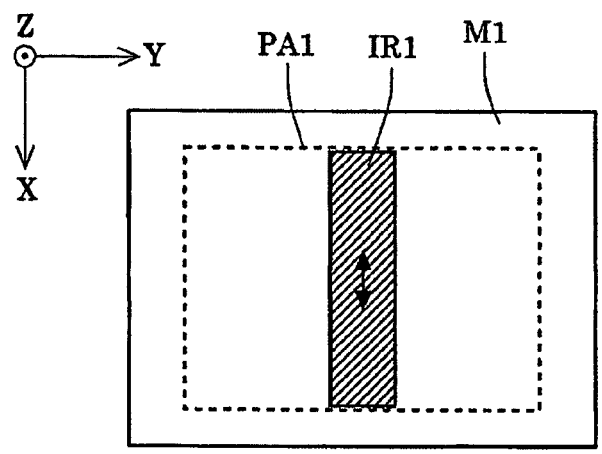
(a)
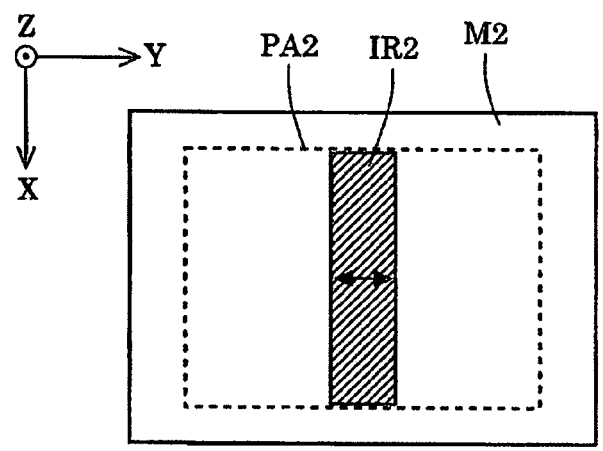
(b)
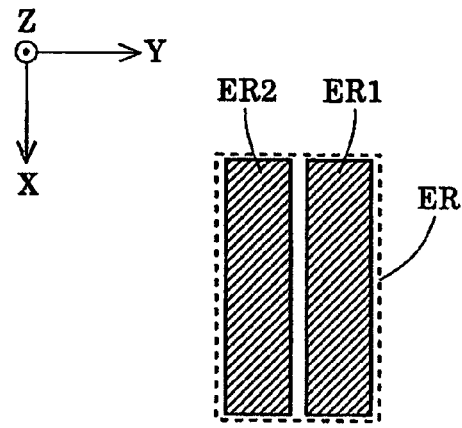
(c)

*Fig.7*
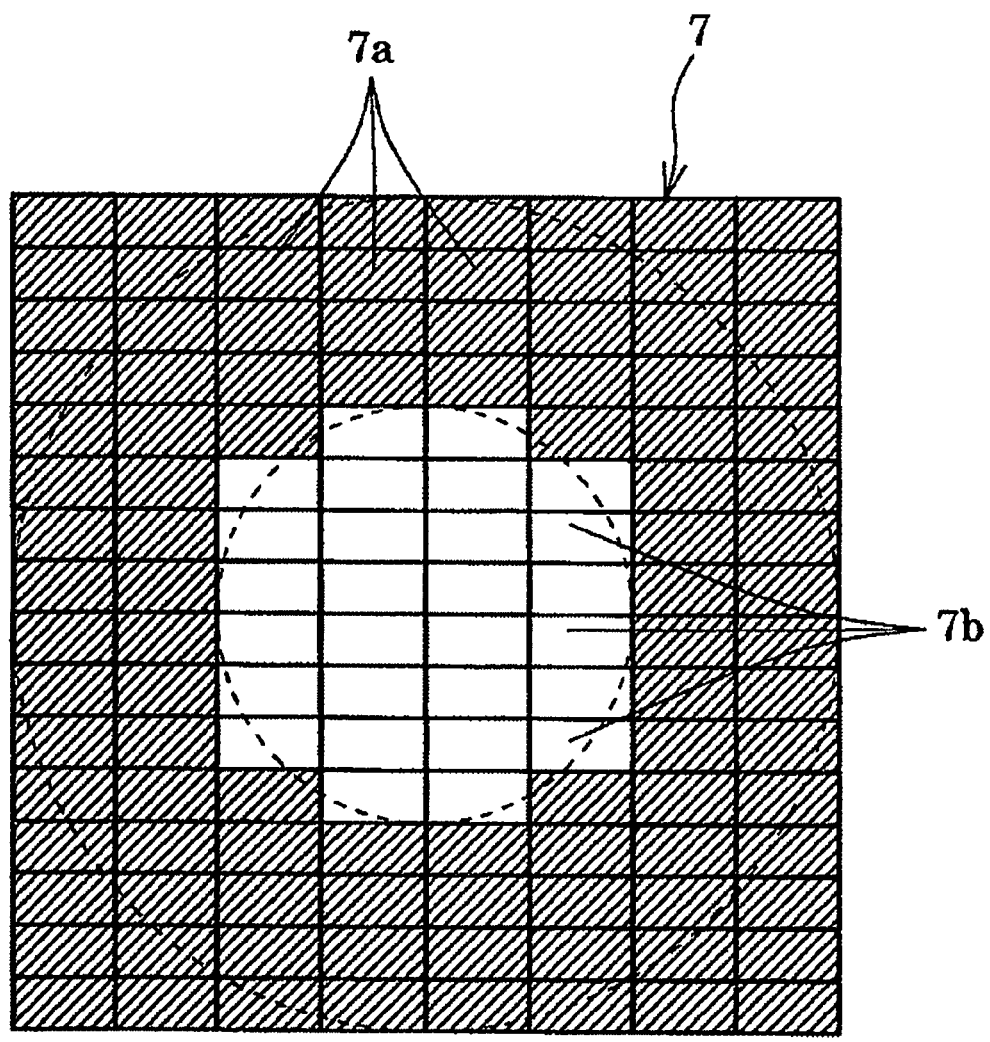
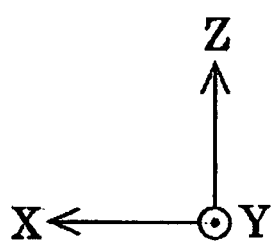

Fig.8
(a)
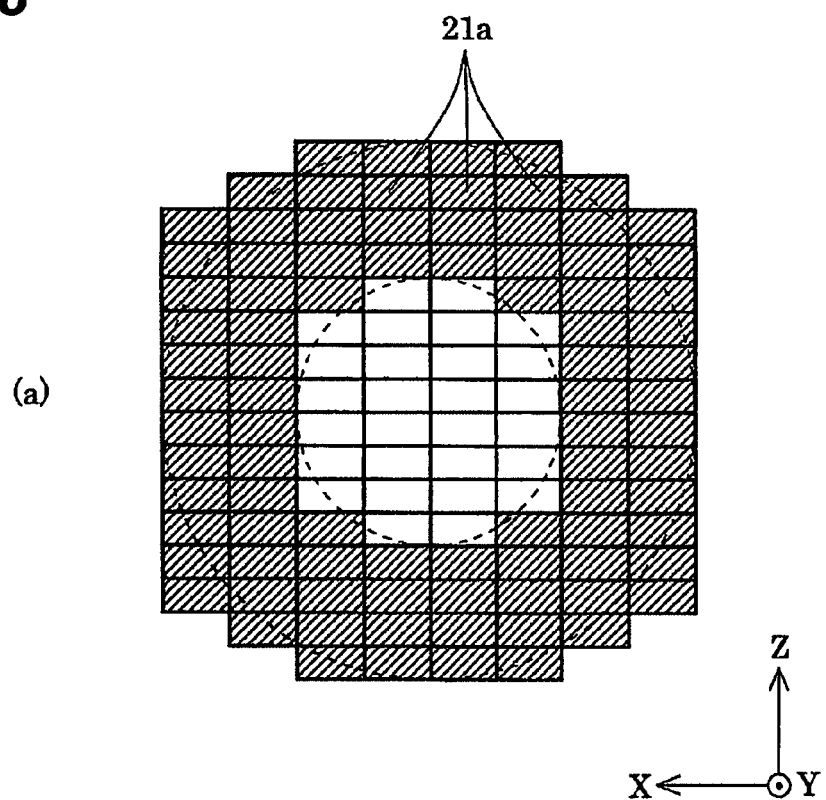
(b)
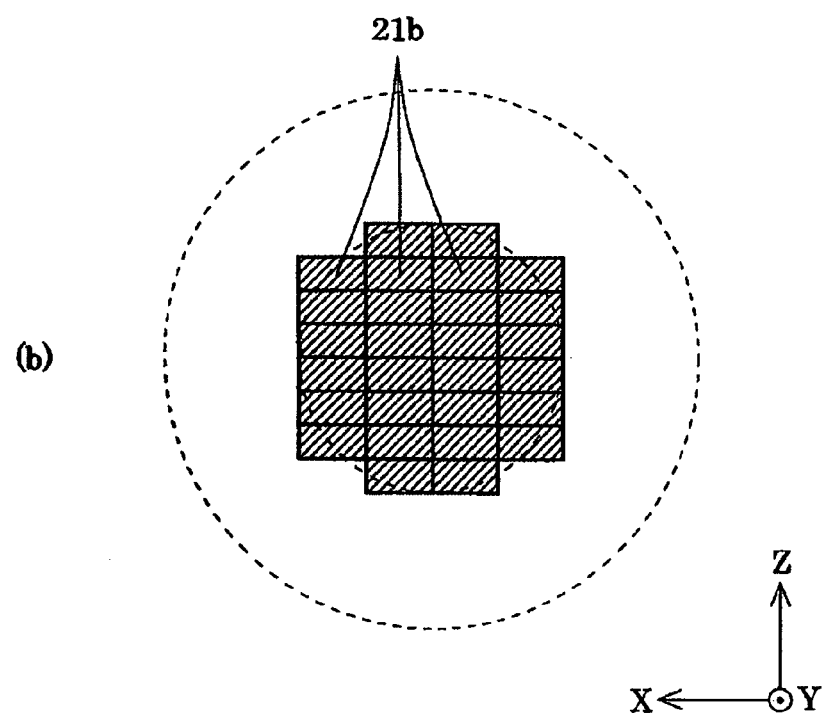

Fig.9
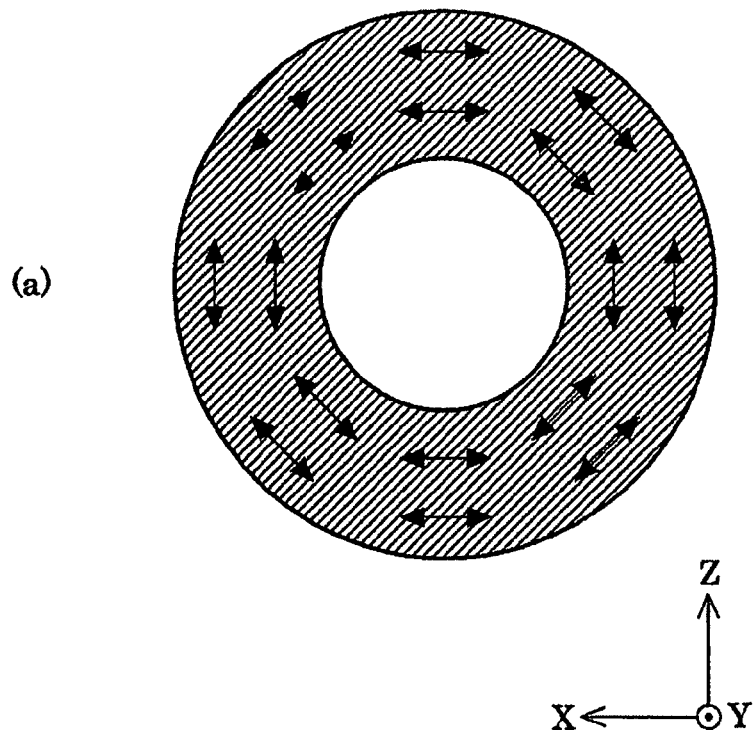
(a)
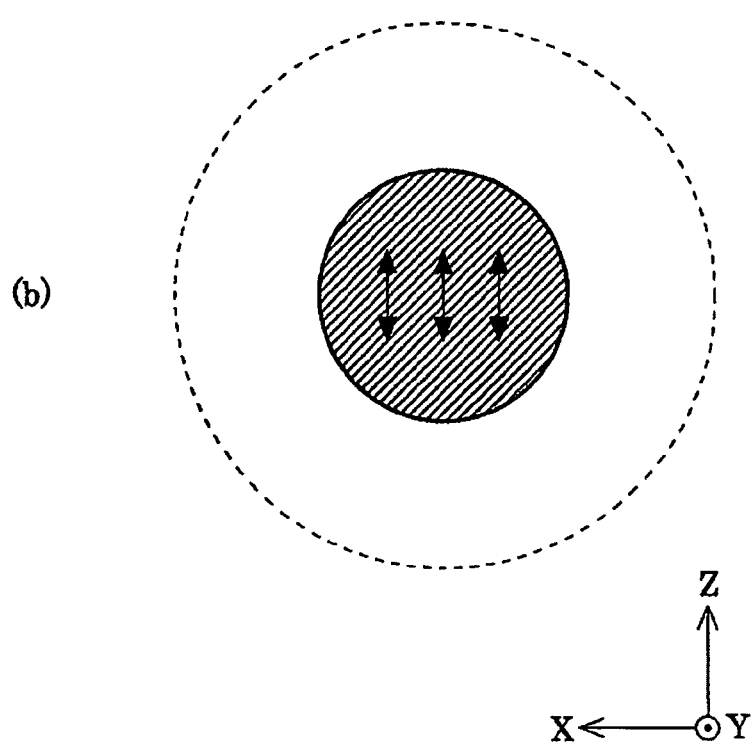
(b)

Fig.11
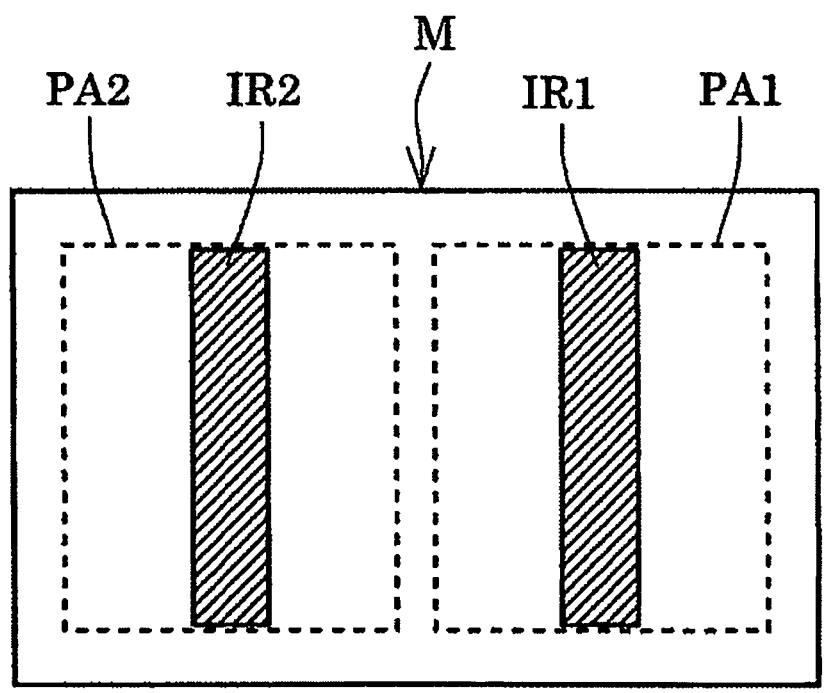
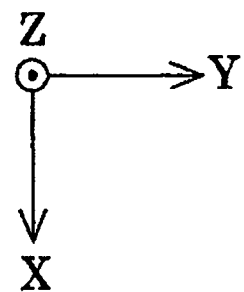

Fig.14
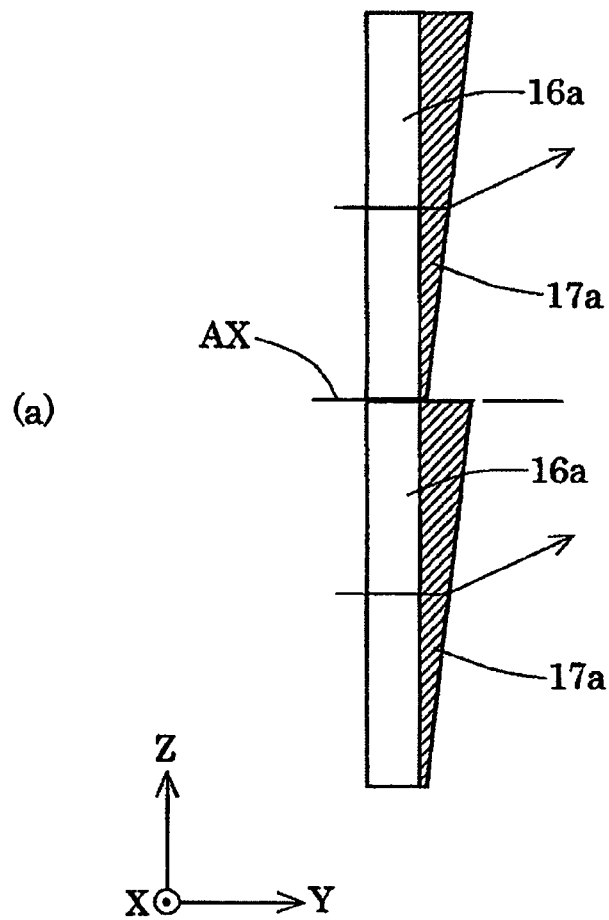
(a)
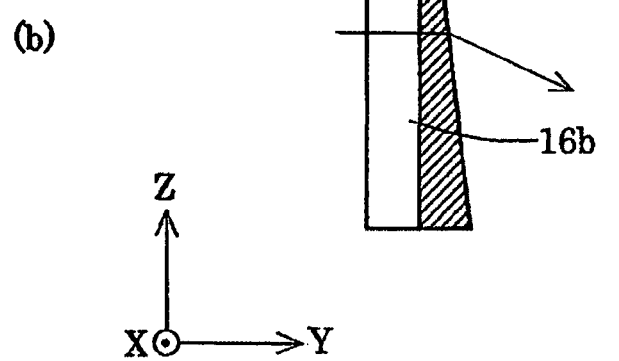
(b)

*Fig.15*
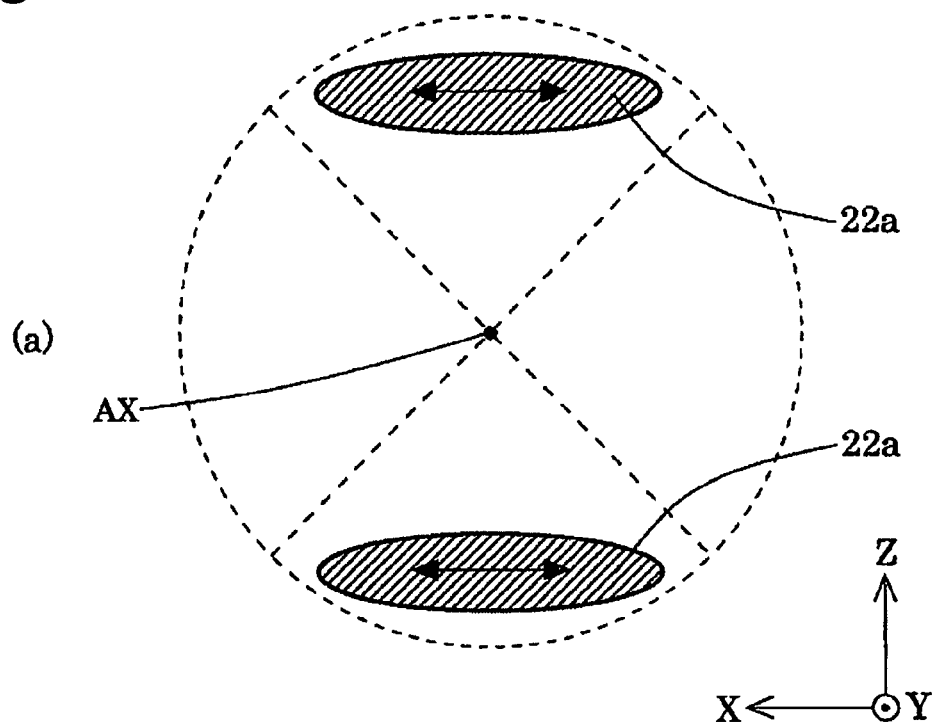
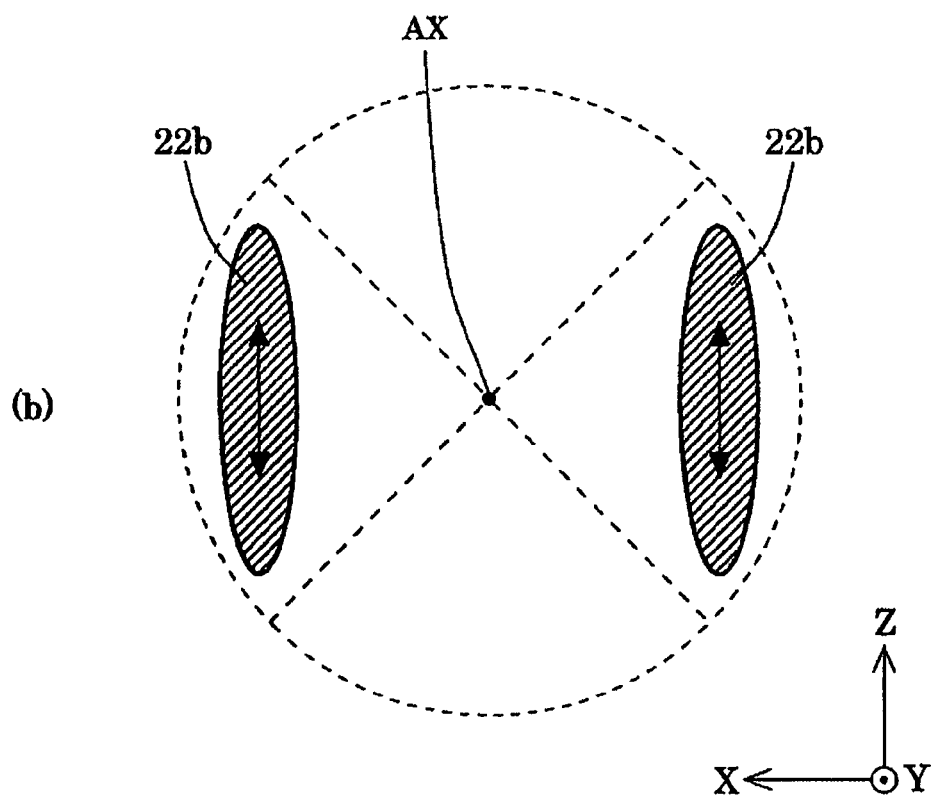

ILLUMINATION OPTICAL APPARATUS, EXPOSURE APPARATUS, AND DEVICE MANUFACTURING METHOD

CROSS-REFERENCE TO RELATED APPLICATIONS

This application is based upon and claims the benefit of priorities from Japanese Patent Application No. 2006-112883 filed on Apr. 17, 2006, and U.S. Provisional Application No. 60/897,874 filed on Jan. 29, 2007, the entire contents of which are incorporated herein by reference.

BACKGROUND

1. Field

An example of the present invention relates to an illumination optical apparatus, an exposure apparatus, and a device manufacturing method and, particularly, to an illumination optical apparatus suitably applicable to exposure apparatus for manufacturing devices such as semiconductor devices, image pickup devices, liquid-crystal display devices, and thin-film magnetic heads by lithography.

2. Description of the Related Art

The photolithography step for manufacturing the semiconductor devices and others is carried out using an exposure apparatus for projecting a pattern image of a mask (or reticle) through a projection optical system onto a photosensitive substrate (wafer or glass plate coated with a photoresist, or the like) to effect exposure thereof. The ordinary exposure apparatus forms a type of pattern in one shot area (unit exposure region) on the photosensitive substrate.

In contrast to it, Japanese Patent Application Laid-open No. 2000-21748 proposes a double exposure method of doubly printing two types of patterns in one shot area on the photosensitive substrate to form a synthetic pattern.

SUMMARY

An example of the present invention shows an illumination optical apparatus having a simple configuration and compact form and being capable of individually illuminating two regions spaced from each other. Another example of the present invention shows an exposure apparatus capable of implementing high-throughput exposure of a fine pattern on a photosensitive substrate by the double exposure method, using the illumination optical apparatus for individually illuminating two regions spaced from each other.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

An embodiment of the present invention provides an illumination optical apparatus comprising:

a beam splitting member located at a position of an illumination pupil or at a position near the illumination pupil, and arranged for splitting an incident beam into a first light beam and a second light beam to form a first illumination region and a second illumination region;

a first light-guide optical system which guides the first light beam to the first illumination region; and a second light-guide optical system which guides the second light beam to the second illumination region located apart from the first illumination region.

Another embodiment of the present invention provides an illumination optical apparatus comprising:

a beam splitting member which splits an incident beam into a first light beam and a second light beam to form a first illumination region and a second illumination region;

a first light-guide optical system which guides the first light beam to the first illumination region;

a second light-guide optical system which guides the second light beam to the second illumination region located apart from the first illumination region; and a common optical system which guides light from a light source to the beam splitting member;

wherein the common optical system has varying means which varies a first illumination condition in the first illumination region and a second illumination condition in the second illumination region.

Still another embodiment of the present invention provides an illumination optical apparatus comprising:

a beam splitting member which splits an incident beam into a first light beam and a second light beam to form a first illumination region and a second illumination region;

a first light-guide optical system which guides the first light beam to the first illumination region;

a second light-guide optical system which guides the second light beam to the second illumination region located apart from the first illumination region; and a setting member located in an optical path between a light source and the beam splitting member and arranged for setting each of a first illumination condition in the first illumination region and a second illumination condition in the second illumination region.

Still another embodiment of the present invention provides an exposure apparatus comprising the illumination optical apparatus of any one of the foregoing embodiments, the exposure apparatus being arranged to effect exposure of predetermined patterns illuminated by the illumination optical apparatus, on a photosensitive substrate.

Still another embodiment of the present invention provides a device manufacturing method comprising:

an exposure step of using the exposure apparatus of the above embodiment to effect exposure of the predetermined patterns on the photosensitive substrate; and a development step of effecting development of the photosensitive substrate after the exposure step.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 4 is a drawing schematically showing a light intensity distribution of a circular shape formed on the illumination pupil by first light beams having passed through first folding members, and a light intensity distribution of a circular shape formed on the illumination pupil by second light beams having passed through second folding members (region (a) schematically shows the circular light intensity distribution formed on the illumination pupil by the first light beams having passed through the first folding members, and region (b) the circular light intensity distribution formed on the illumination pupil by the second light beams having passed through the second folding members).

FIG. 5 is a drawing showing a first illumination region of a rectangular shape formed on a first mask, a second illumination region of a rectangular shape formed on a second mask, and, a pattern image of the first mask illuminated by the first illumination region and a pattern image of the second mask illuminated by the second illumination region (region (a) shows the rectangular first illumination region formed on the first mask, region (b) the rectangular second illumination region formed on the second mask, and region (c) the pattern image of the first mask illuminated by the first illumination region and the pattern image of the second mask illuminated by the second illumination region).

FIG. 7 is a drawing schematically showing a configuration of a beam splitting member according to a modification example of the first embodiment.

FIG. 8 is a drawing schematically showing a light intensity distribution of an annular shape formed on the illumination pupil by the first light beams having passed through first folding members, and a light intensity distribution of a circular shape formed on the illumination pupil by the second light beams having passed through second folding members (region (a) schematically shows the annular light intensity distribution formed on the illumination pupil by the first light beams having passed through the first folding members, and region (b) the circular light intensity distribution formed on the illumination pupil by the second light beams having passed through the second folding members).

FIG. 9 is a drawing showing a polarization state of the annular light intensity distribution formed on the illumination pupil by the first light beams, and a polarization state of the circular light intensity distribution formed on the illumination pupil by the second light beams (region (a) shows the polarization state of the annular light intensity distribution formed on the illumination pupil by the first light beams, and region (b) the polarization state of the circular light intensity distribution formed on the illumination pupil by the second light beams).

FIG. 11 is a drawing showing two rectangular illumination regions formed on a mask in the modification example of the first embodiment.

FIG. 14 is a partial sectional view along line XIVa-XIVa and a partial sectional view along lines XIVb-XIVb in FIG. 13.

FIG. 15 is a drawing showing a light intensity distribution of a Z-directionally dipolar shape formed on the illumination pupil by the first light beams and a light intensity distribution of an X-directionally dipolar shape formed on the illumination pupil by the second light beams (region (a) shows the Z-directionally dipolar light intensity distribution formed on the illumination pupil by the first light beams, and region (b) the X-directionally dipolar light intensity distribution formed on the illumination pupil by the second light beams).

DETAILED DESCRIPTION

Figure 1:
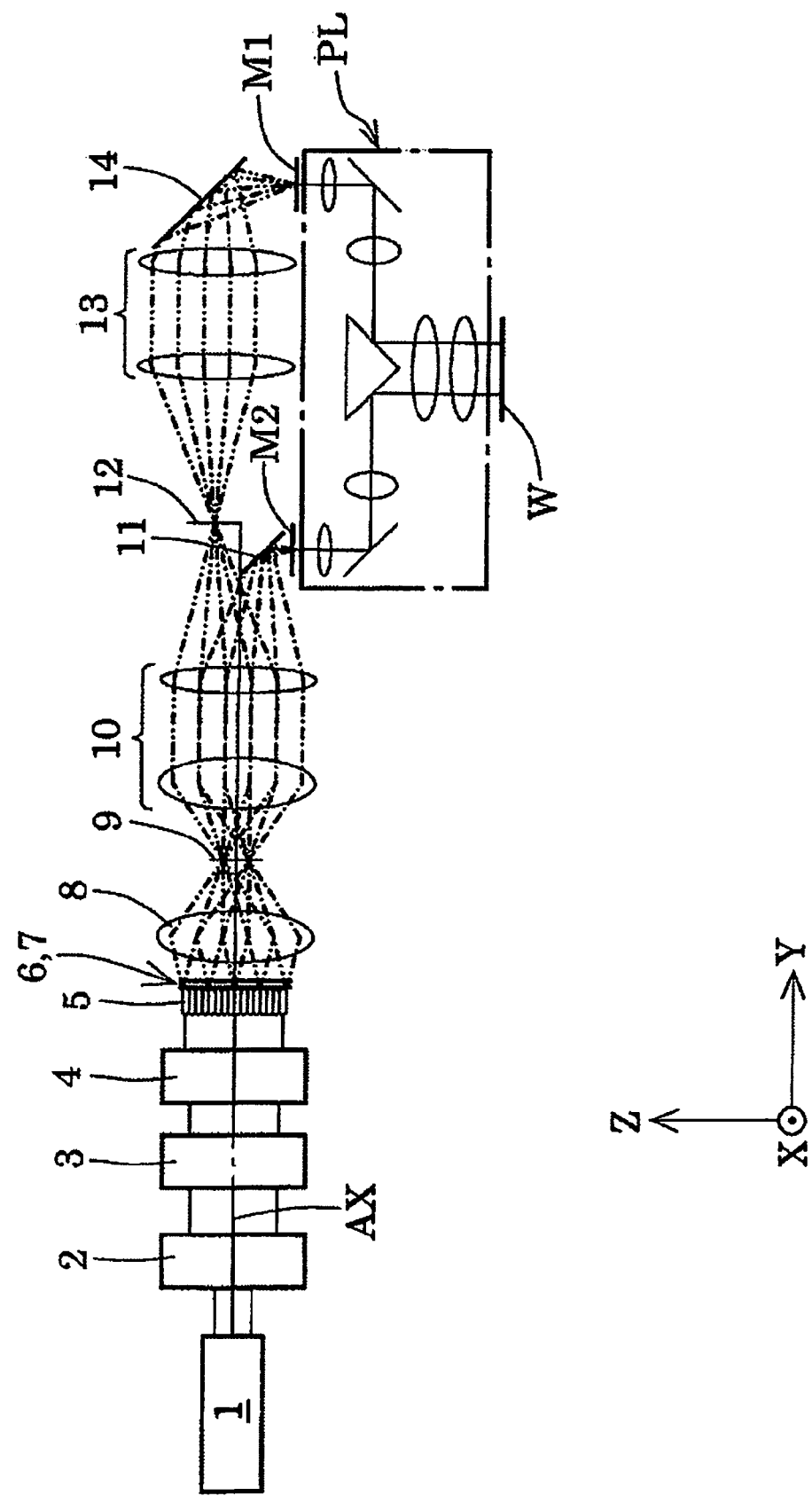
FIG. 1 is a drawing schematically showing a configuration of an exposure apparatus according to a first embodiment of the present invention.

Embodiments of the present invention will be described on the basis of the accompanying drawings. FIG. 1 is a drawing schematically showing a configuration of an exposure apparatus according to the first embodiment of the present invention. In FIG. 1, the Z-axis is set along a direction of a normal to a wafer W being a photosensitive substrate, the Y-axis along a direction parallel to the page of FIG. 1 in the surface of the wafer W, and the X-axis along the direction perpendicular to the page of FIG. 1 in the surface of the wafer W. With reference to FIG. 1, the exposure apparatus of the first embodiment is provided with a light source 1 for supplying exposure light (illumination light).

The light source 1 applicable herein is, for example, an ArF excimer laser light source for supplying light having the wavelength of about 193 nm, or a KrF excimer laser light source for supplying light having the wavelength of about 248 nm. A nearly parallel beam emitted from the light source 1 travels through a beam transmitting system 2 having a well-known configuration, to be shaped into a beam having a predetermined rectangular cross section, and thereafter the beam enters a polarization state varying part 3. The beam transmitting system 2 has functions of guiding the incident beam to the polarization state varying part 3 while converting it into a beam having a cross section of an appropriate size and shape, and actively correcting positional variation and angular variation of the beam incident to the next-stage polarization state varying part 3.

The polarization state varying part 3 has a function of varying a polarization state of the illumination light incident to a next-stage fly's eye lens (or micro fly's eye lens) 5. Specifically, the polarization state varying part 3 is composed, for example, of the following components in order from the light source side: a half wave plate made of rock crystal, an angle-deviation prism of rock crystal or rock-crystal prism, and an angle-deviation prism of quartz glass or quartz prism. Each of the half wave plate, rock-crystal prism, and quartz prism is arranged to be rotatable around the optical axis AX. The rock-crystal prism has a depolarizing action and the quartz prism has a function of correcting curvature of rays due to the angle-deviation action of the rock-crystal prism.

As the direction of the crystallographic axis of the half wave plate and the direction of the crystallographic axis of the rock-crystal prism are appropriately set, the polarization state varying part 3 converts linearly polarized light coming from the beam transmitting system 2, into linearly polarized light having a different vibration direction, converts the incident linearly polarized light into unpolarized light, or outputs the incident linearly polarized light directly without conversion. After the polarization state is varied according to need by the polarization state varying part 3, the beam travels through a beam shape varying part 4 to enter the fly's eye lens 5.

The beam shape varying part 4 includes, for example, a diffractive optical element, a power-varying optical system, etc. and has a function of varying the size and shape of the illumination field formed on the entrance surface of the fly's eye lens 5 and, therefore, varying the size and shape of a surface illuminant formed on the rear focal plane (illumination pupil) of the fly's eye lens 5. The beam incident to the fly's eye lens 5 is two-dimensionally split by a large number of small lens elements and small light sources are formed on respective rear focal planes of the small lens elements into which the beam is incident.

In this way, a substantial surface illuminant consisting of a large number of small light sources is formed on the rear focal plane of the fly's eye lens 5. Beams from the fly's eye lens 5 travel through a polarization varying member (polarization setting member or polarizing member) 6 and a beam splitting member 7 located near the exit surface of the fly's eye lens 5, to enter a condenser optical system 8. The beam splitting member 7 has a function of splitting the incident beams into first light beams traveling along a first direction and second light beams traveling along a second direction, and its configuration and action will be described later.

The polarization varying member 6 has a function of varying a polarization state of at least either one of the first light beams (precisely, beams corresponding to the first light beams) and the second light beams (precisely, beams corresponding to the second light beams), and its configuration and action will be described later. The first light beams folded obliquely upward in the drawing and the second light beams folded obliquely downward in the drawing through the beam splitting member 7 travel through the condenser optical system 8 to illuminate a first mask blind 9 in a superimposed manner. An illumination field of a rectangular shape according to the shape of each small lens element forming the fly's eye lens 5 is formed on the first mask blind 9 as an illumination field stop.

The second light beams having passed through a rectangular aperture (optically transparent portion) of the first mask blind 9 travel through an imaging optical system 10 and via a path-folding reflector 11 to illuminate a second mask M2 in a superimposed manner. On the other hand, the first light beams having passed through the rectangular aperture of the first mask blind 9 travel through the imaging optical system 10 to illuminate a second mask blind 12 in a superimposed manner. An illumination field of a rectangular shape according to the shape of each small lens element forming the fly's eye lens 5 is also formed on the second mask blind 12, as on the first mask blind 9.

The first light beams having passed through a rectangular aperture of the second mask blind 12 travel through a relay optical system 13 and via a path-folding reflector 14 to illuminate a first mask M1 in a superimposed manner. The first light beams transmitted by the first mask M1 and the second light beams transmitted by the second mask M2 travel through a so-called double-headed projection optical system PL to form a pattern image of the first mask M1 and a pattern image of the second mask M2, respectively, on a wafer (photosensitive substrate) W. The double-headed projection optical system PL is an optical system having two effective fields spaced from each other, and one effective imaging region.

Figure 2:
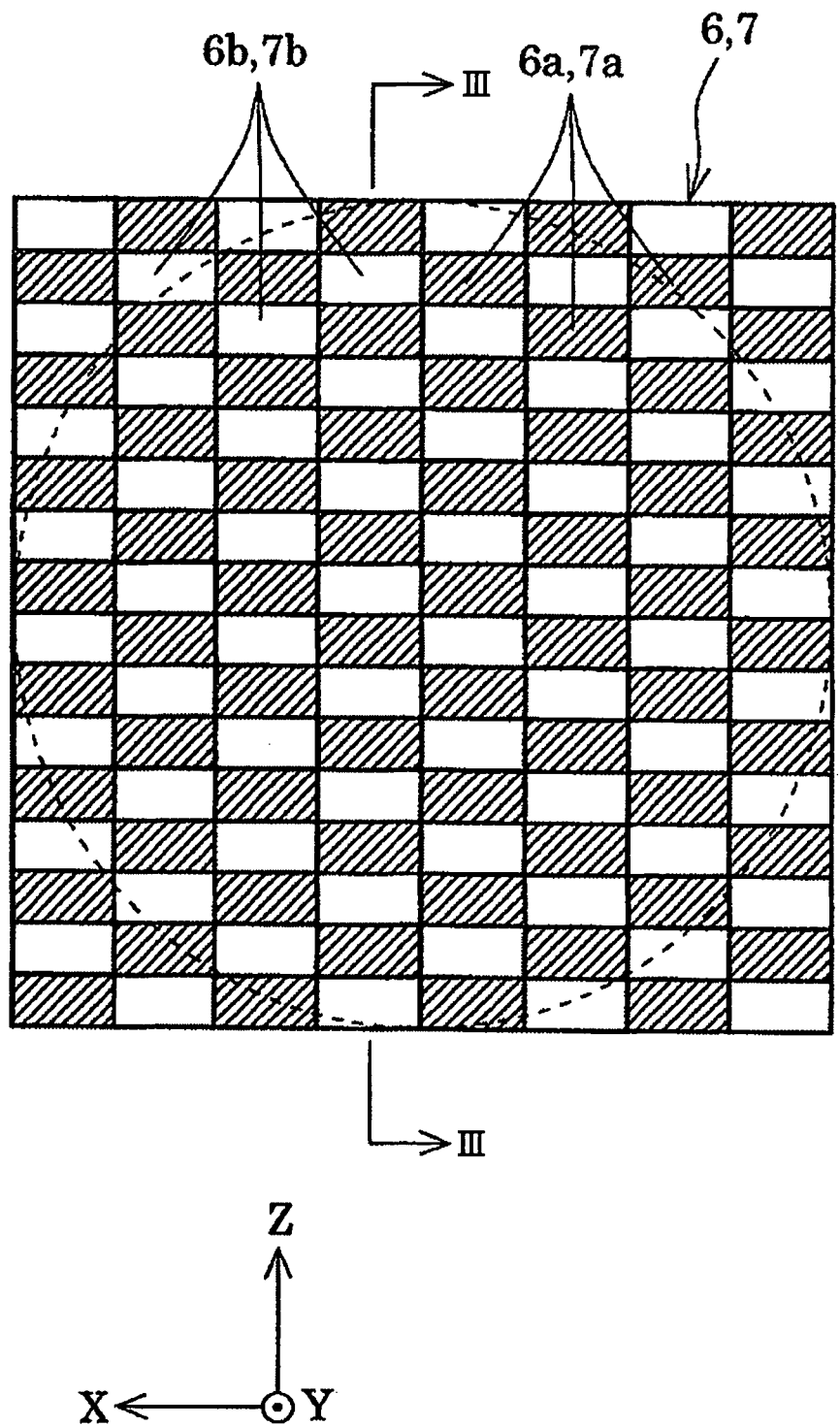
FIG. 2 is a drawing of a beam splitting member viewed along the optical axis from a condenser optical system in the first embodiment.
Figure 3:
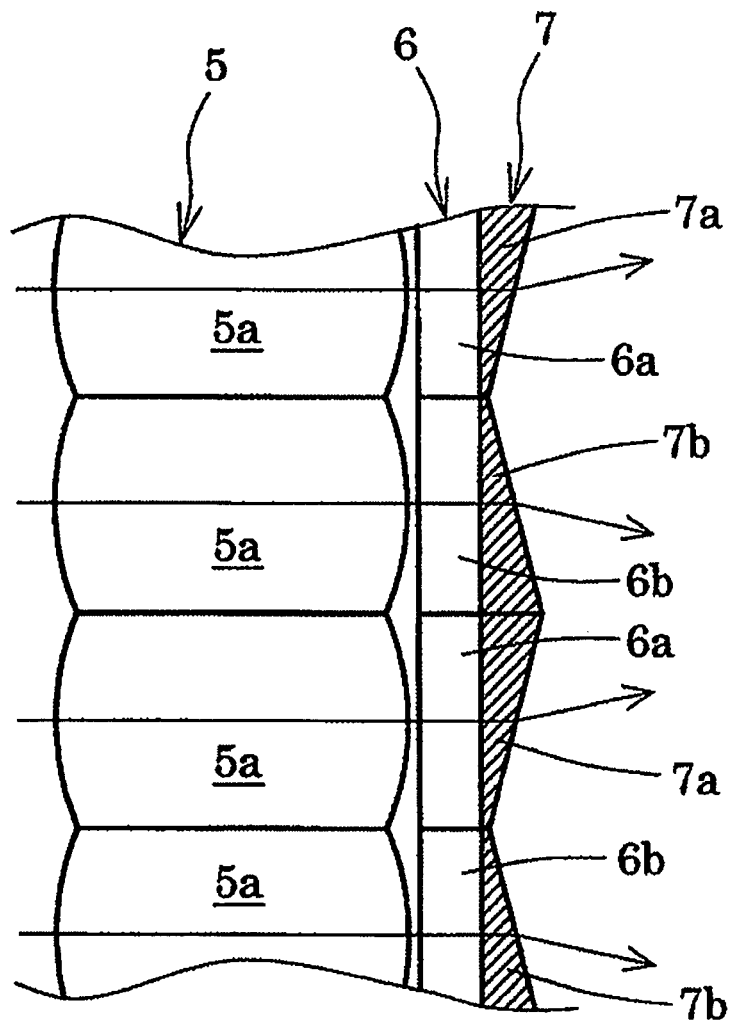
FIG. 3 is a partial sectional view along line III-III in FIG. 2.

FIG. 2 is a drawing of the beam splitting member viewed along the optical axis from the condenser optical system in the first embodiment. FIG. 3 is a partial sectional view along line III-III in FIG. 2. With reference to FIGS. 2 and 3, the polarization varying member 6 is composed of two types of optical rotation members 6a, 6b arranged vertically and horizontally and densely so as to correspond to the respective small lens elements 5a (wavefront splitting regions) constituting the fly's eye lens 5. Similarly, the beam splitting member 7 is composed of two types of folding members 7a, 7b arranged vertically and horizontally and densely so as to correspond to the respective small lens elements 5a constituting the fly's eye lens 5. For clarification of the drawing, FIG. 2 is so depicted that the number of optical rotation members 6a, 6b and folding members 7a, 7b arranged so as to correspond to the respective wavefront splitting regions of the fly's eye lens 5 is smaller than the actual number.

The optical rotation members 6a, 6b are made of rock crystal being an optical material with an optical rotatory power, each of them has a form of a plane-parallel plate of a rectangular contour shape, and the crystallographic axis thereof is set along the Y-direction. In this case, incident linearly polarized light is optically rotated by the optical rotatory power of the optical rotation members 6a, 6b and the light emerges in a state in which the polarization direction is rotated by a predetermined angle around the Y-axis. Specifically, the thickness of the first optical rotation members 6a indicated by rectangular hatching regions in FIG. 2 is so set that when linearly polarized light having the polarization direction along the Z-direction is incident thereto, they emit linearly polarized light having the polarization direction along a direction resulting from +90° rotation of the Z-direction around the Y-axis, i.e., along the X-direction.

On the other hand, the thickness of the second optical rotation members 6b indicated by rectangular outline regions in FIG. 2 is so set that when linearly polarized light having the polarization direction along the Z-direction is incident thereto, they emit linearly polarized light having the polarization direction along a direction resulting from +180° rotation of the Z-direction around the Y-axis, i.e., along the Z-direction. In other words, the first optical rotation members 6a have a function of converting incident vertically polarized light into horizontally polarized light, and the second optical rotation members 6b have a function of transmitting incident linearly polarized light without any change in the polarization state thereof.

The folding members 7a, 7b are made, for example, of quartz, and each of them has a form of a folding prism whose contour shape is rectangular and whose sectional shape is wedge-shaped. Specifically, the first folding members 7a indicated by rectangular hatching regions in FIG. 2 are arranged so as to correspond to the first optical rotation members 6a, as shown in FIG. 3, and are configured to fold rays incident along the Y-direction, into an obliquely upward direction in the drawing. On the other hand, the second folding members 7b indicated by rectangular outline regions in FIG. 2 are arranged so as to correspond to the second optical rotation members 6b and are configured so as to fold rays incident along the Y-direction, into an obliquely downward direction in the drawing. In the first embodiment, as shown in FIG. 2, the first folding members 7a and second folding members 7b each are arranged so as to form a checkered pattern.

The following will explain an illustrative case where beams of linearly polarized light having a circular cross section as indicated by a dashed line in FIG. 2 and having the polarization direction along the Z-direction are incident from the fly's eye lens 5 into the polarization varying member 6 by virtue of the actions of the polarization state varying part 3 and the beam shape varying part 4. In this case, the first light beams after converted into the X-directional linear polarization state having the polarization direction along the X-direction through the first optical rotation members 6a and folded into the obliquely upward direction in FIG. 1 through the first folding members 7a form a circular light intensity distribution as schematically shown in FIG. 4(a), at or near the pupil of the imaging optical system 10, and, therefore, at the position of the pupil of the relay optical system 13 or at the position of the illumination pupil near it. The beams forming this circular light intensity distribution are in the X-directional linear polarization state on the illumination pupil (corresponding to the X-directional linear polarization state on the first mask M1).

On the other hand, the second light beams after kept in the Z-directional linear polarization state having the polarization direction along the Z-direction through the second optical rotation members 6b and folded into the obliquely downward direction in FIG. 1 through the second folding members 7b form a circular light intensity distribution as schematically shown in FIG. 4(b), at the position of the pupil of the imaging optical system 10 or at the position of the illumination pupil near it. The beams forming this circular light intensity distribution are in the Z-directional linear polarization state on the illumination pupil (corresponding to the Y-directional linear polarization state on the second mask M2). Rectangular regions 20a hatched in FIG. 4(a) are light regions corresponding to the beams having passed through the first optical rotation members 6a and the first folding members 7a, and rectangular regions 20b hatched in FIG. 4(b) are light regions corresponding to the beams having passed through the second optical rotation members 6b and the second folding members 7b. In FIGS. 4(a) and (b), the two-headed arrows indicate the polarization directions of light, and the circle indicated by a dashed line corresponds to a cross section of the beams incident from the fly's eye lens 5 into the polarization varying member 6.

The first light beams forming the circular light intensity distribution on the pupil of the relay optical system 13 or on the illumination pupil near it form an illumination region IR1 of a rectangular shape elongated along the X-direction on the first mask M1, as shown in FIG. 5(a). The second light beams forming the circular light intensity distribution on the pupil of the imaging optical system 10 or on the illumination pupil near it form an illumination region IR2 of a rectangular shape elongated along the X-direction on the second mask M2, as shown in FIG. 5(b). As indicated by the two-headed arrows in FIGS. 5(a) and (b), the beams forming the first illumination region IR1 are in the X-directional linear polarization state, and the beams forming the second illumination region IR2 are in the Y-directional linear polarization state.

Namely, in a pattern region PA1 of the first mask M1, a pattern corresponding to the first illumination region IR1 is circularly illuminated by the light in the X-directional linear polarization state. In a pattern region PA2 of the second mask M2, a pattern corresponding to the second illumination region IR2 is circularly illuminated by the light in the Y-directional linear polarization state. In this manner, as shown in FIG. 5(c), a pattern image of the first mask M1 illuminated by the first illumination region IR1 is formed in a first region ER1 of a rectangular shape elongated along the X-direction in an effective imaging region ER of the projection optical system PL, and a pattern image of the second mask M2 illuminated by the second illumination region IR2 is formed in a second region ER2 having a rectangular contour shape elongated similarly along the X-direction in the effective imaging region ER, and located in parallel in the Y-direction to the first region ER1.

In the first embodiment, while the first mask M1, second mask M2, and wafer W are synchronously moved along the Y-direction relative to the projection optical system PL, double scanning exposure of the pattern of the first mask M1 and the pattern of the second mask M2 is implemented in one shot area on the wafer W to form a synthetic pattern. The above-described double scanning exposure is repeated with two-dimensional step movement of the wafer W along the XY plane relative to the projection optical system PL, whereby synthetic patterns of the pattern of the first mask M1 and the pattern of the second mask M2 are sequentially formed in respective shot areas on the wafer.

In the first embodiment, as described above, the incident beams from the fly's eye lens 5 are split into the first light beams traveling along the obliquely upward direction (first direction) in FIG. 1 and the second light beams traveling along the obliquely downward direction (second direction) in FIG. 1 by the action of the beam splitting member 7 located near the exit surface of the fly's eye lens 5 (i.e., on or near the illumination pupil). The first light beams separated through the beam splitting member 7 are guided through a first light-guide optical system consisting of the condenser optical system 8, imaging optical system 10, and relay optical system 13, to the first illumination region IR1.

On the other hand, the second light beams separated through the beam splitting member 7 are guided through a second light-guide optical system consisting of the condenser optical system 8 and the imaging optical system 10, to the second illumination region IR2 located apart from the first illumination region IR1. Namely, the first light beams and the second light beams immediately after passage through the beam splitting member 7 are guided through a common optical system consisting of the condenser optical system 8 and the imaging optical system 10, to the first illumination region IR1 and to the second illumination region IR2, respectively. It is, however, noted that the first light beams are separated from the second light beams through the common optical system (8, 10) and thereafter guided through the relay optical system 13 to the first illumination region IR1.

Since the illumination optical apparatus (1-14) of the first embodiment is arranged to split the beam at or near the illumination pupil as described above, it is able to guide the two types of beams immediately after the separation, through the common optical system (8, 10) to the two regions IR1, IR2 spaced from each other. As a result, it is able to individually illuminate the two regions IR1, IR2 spaced from each other, while realizing the simple configuration and compact form based on the common optical path. Therefore, the exposure apparatus of the first embodiment is able to effect exposure of a fine pattern at high throughput on the wafer W by the double exposure method, using the illumination optical apparatus for individually illuminating the two regions IR1, IR2 spaced from each other.

The first embodiment is arranged to change only the polarization state of the first light beams and maintain the polarization state of the second light beams, out of the first light beams and the second light beams separated through the beam splitting member 7, by virtue of the action of the polarization varying member 6 located in vicinity to the beam splitting member 7. As a result, the first illumination region IR1 and the second illumination region IR2 can be illuminated by the light beams in the mutually different polarization states, i.e., the two illumination regions IR1, IR2 can be individually illuminated under mutually different illumination conditions about the polarization states, by virtue of the action of the polarization varying member 6.

Figure 6:
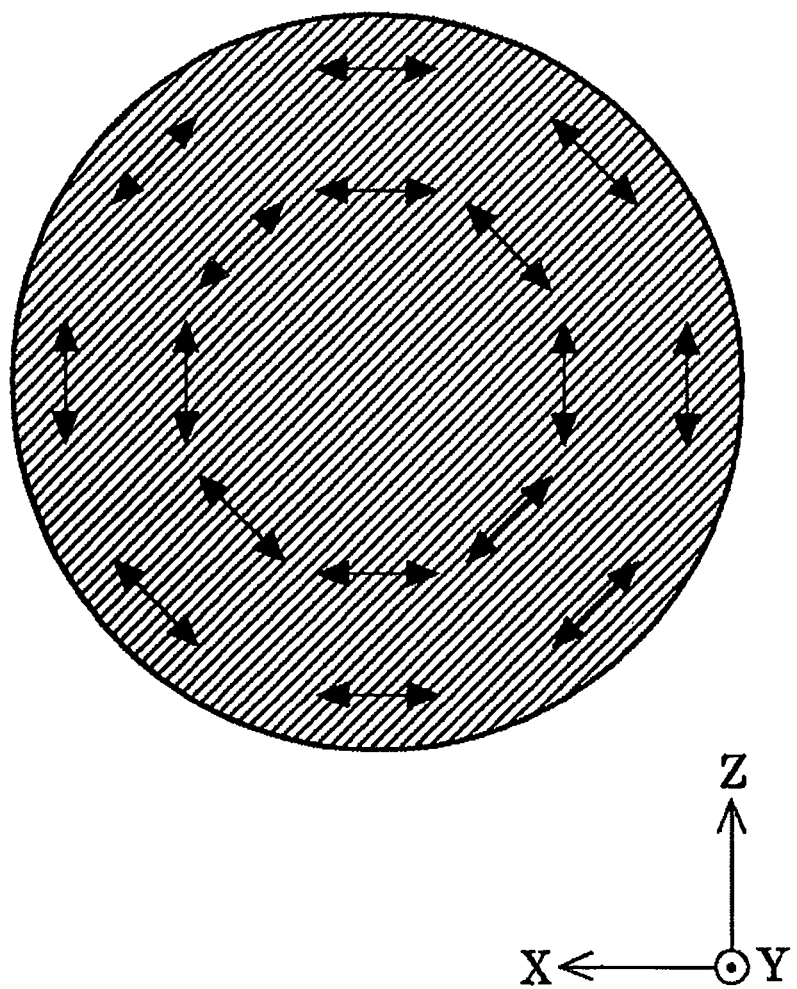
FIG. 6 is a drawing showing a state in which the circular light intensity distribution formed on the illumination pupil by the first light beams or the second light beams is set in a circumferential polarization state.

The above-described first embodiment is arranged to set the polarization state of the circular light intensity distribution formed on the illumination pupil by the first light beams, in the X-directional linear polarization state and to set the polarization state of the circular light intensity distribution formed on the illumination pupil by the second light beams, in the Y-directional linear polarization state. However, without having to be limited to this, it is also possible, for example as shown in FIG. 6, to set the polarization state of the circular light intensity distribution formed on the illumination pupil by the first light beams or by the second light beams, in a circumferential polarization state. In the circumferential polarization state, as indicated by two-headed arrows in the drawing, the polarization state of light passing through the circular light intensity distribution formed on the illumination pupil is set in a linear polarization state of vibration in the circumferential direction. In general, it is feasible to implement various forms as to the polarization state of the light intensity distribution formed on the illumination pupil by the first light beams or by the second light beams, by changing the number of types of optical rotation members forming the polarization varying member 6, the optical rotation characteristics of the respective types of optical rotation members, the arrangement of the types of optical rotation members, the polarization state of the light incident to the polarization varying member 6, and so on.

In the above-described first embodiment, the first light beams and the second light beams form the circular light intensity distributions on the illumination pupil. However, without having to be limited to this, it is also feasible to implement various forms as to the contour shapes of the light intensity distributions formed on the illumination pupil by the first light beams and by the second light beams, by changing the arrangement of the first folding members 7a and the second folding members 7b constituting the beam splitting member 7, the sectional shape of the beams incident to the beam splitting member 7, and so on. The below will describe as an example, a modification of the beam splitting member by which the first light beams form an annular light intensity distribution on the illumination pupil and by which the second light beams form a circular light intensity distribution on the illumination pupil.

FIG. 7 is a drawing schematically showing a configuration of a beam splitting member according to the modification example of the first embodiment. In the beam splitting member 7 shown in FIG. 7, the first folding members 7a indicated by rectangular hatching regions are arranged to fold rays incident along the Y-direction, into the obliquely upward direction in FIG. 1, and the second folding members 7b indicated by rectangular outline regions are arranged to fold rays incident along the Y-direction, into the obliquely downward direction in FIG. 1. In FIG. 7, a large circle indicated by a dashed line represents a cross section of the beams incident from the fly's eye lens 5 into the polarization varying member 6, and a small circle indicated by a dashed line is concentric with the large circle.

In the modification example shown in FIG. 7, the second folding members 7b are intensively arranged in the central part of the beam splitting member 7 so as to correspond to the small circle indicated by the dashed line, and the first folding members 7a are arranged so as to surround this group of second folding members 7b. Therefore, in the case where the beams having the circular cross section are incident from the fly's eye lens 5 through the polarization varying member 6 into the beam splitting member 7, the first light beams folded into the obliquely upward direction in FIG. 1 through the first folding members 7a form an annular light intensity distribution as schematically shown in FIG. 8(a), at the position of the pupil of the relay optical system 13 or at the position of the illumination pupil near it. On the other hand, the second light beams folded into the obliquely downward direction in FIG. 1 through the second folding members 7b form a circular light intensity distribution as schematically shown in FIG. 8(b), at the position of the pupil of the imaging optical system 10 or at the position of the illumination pupil near it.

Rectangular regions 21a hatched in FIG. 8(a) are light regions corresponding to the beams having passed through the first folding members 7a, and rectangular regions 21b hatched in FIG. 8(b) are light regions corresponding to the beams having passed through the second folding members 7b. In FIGS. 8(a) and (b), the large circle indicated by a dashed line corresponds to the cross section of the beams incident from the fly's eye lens 5 into the beam splitting member 7. In the modification example shown in FIG. 7, as arranged in this manner, the first light beams forming the annular light intensity distribution on the pupil of the relay optical system 13 or on the illumination pupil near it annularly illuminate the first illumination region IR1 on the first mask M1. The second light beams forming the circular light intensity distribution on the pupil of the imaging optical system 10 or on the illumination pupil near it circularly illuminate the second illumination region IR2 on the second mask M2.

In the modification example shown in FIG. 7, as described above, it is feasible to implement various forms as to the polarization state of the light intensity distribution formed on the illumination pupil by the first light beams or by the second light beams, by changing the number of types of optical rotation members forming the polarization varying member 6, the optical rotation characteristics of the respective types of optical rotation members, the arrangement of the types of optical rotation members, the polarization state of the light incident to the polarization varying member 6, and so on. Specifically, as shown in FIG. 9(a), the polarization state of the annular light intensity distribution formed on the illumination pupil by the first light beams can be set, for example, in the circumferential polarization state. Furthermore, the polarization state of the circular light intensity distribution formed on the illumination pupil by the second light beams can be set, for example, in the Z-directional linear polarization state (or in the X-directional linear polarization state, in an unpolarized state, or the like), as shown in FIG. 9(b).

Figure 10:
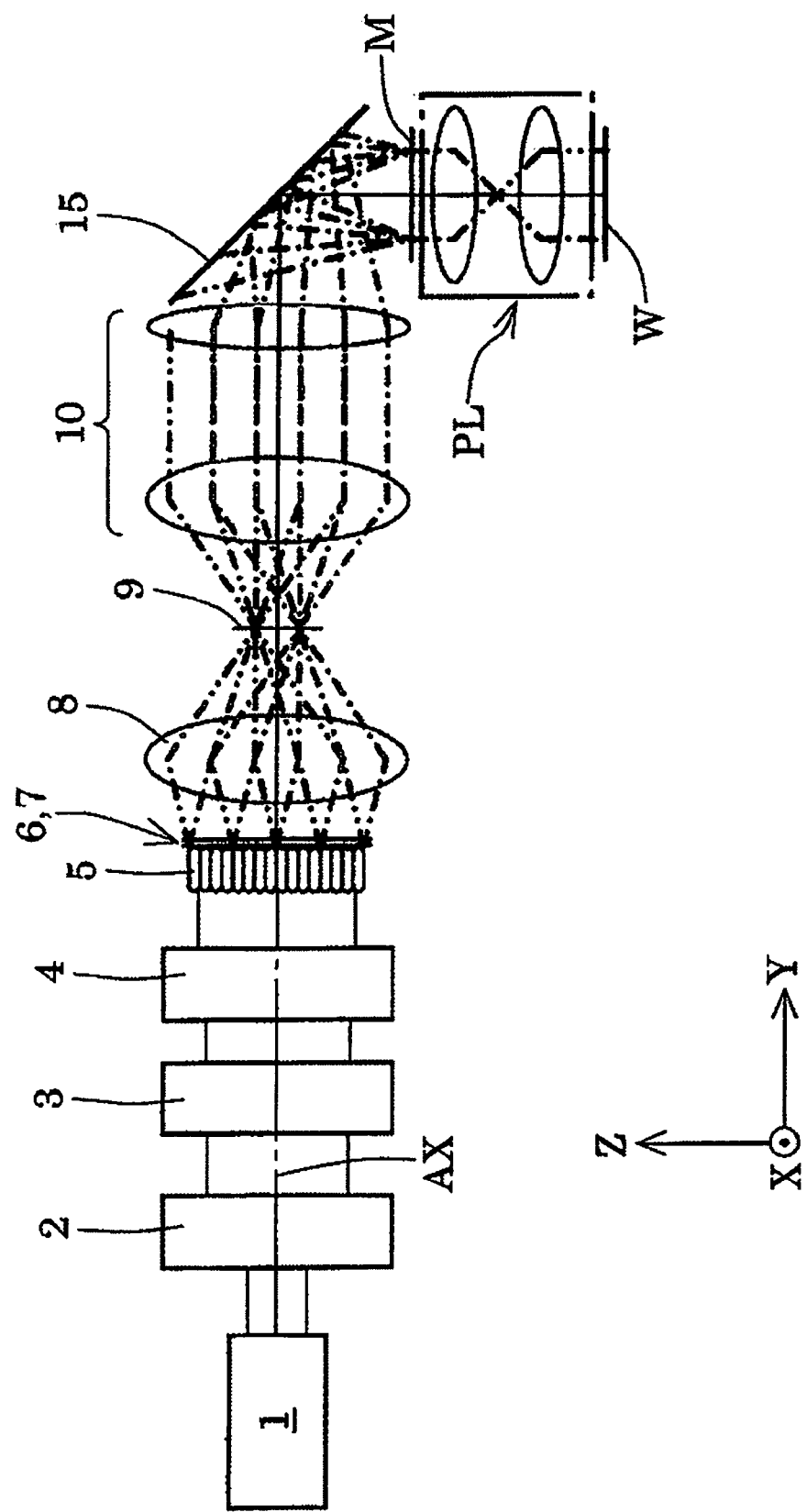
FIG. 10 is a drawing schematically showing a configuration of an exposure apparatus according to a modification example of the first embodiment.

In the above-described first embodiment, the first light beams form the first illumination region IR1 on the first mask M1, while the second light beams form the second illumination region IR2 on the second mask M2. However, without having to be limited to this, it is also possible to adopt a modification example of the exposure apparatus in which the first illumination region IR1 formed by the first light beams and the second illumination region IR2 formed by the second light beam are arranged in parallel on a common mask. FIG. 10 is a drawing schematically showing a configuration of an exposure apparatus according to a modification example of the first embodiment.

The exposure apparatus according to the modification example of FIG. 10 has a configuration similar to the exposure apparatus of the embodiment shown in FIG. 1. In fact, the configuration from the light source 1 to the imaging optical system 10 in the modification example of FIG. 10 is exactly the same as in the embodiment of FIG. 1. However, the modification example of FIG. 10 is basically different from the embodiment of FIG. 1 in that a path-folding reflector 15 for reflecting the first light beams and the second light beams having passed through the imaging optical system 10, toward the common mask M is provided immediately after the imaging optical system 10 and in that, for example, an ordinary refracting optical system is used as the projection optical system PL. The modification example of FIG. 10 will be described below with focus on the differences from the embodiment of FIG. 1.

In the modification example of FIG. 10, the first light beams separated through the beam splitting member 7 form, for example, a circular light intensity distribution at the position of the pupil of the imaging optical system 10 or at the position of the illumination pupil near it, and then travel via the path-folding reflector 15 to form a rectangular illumination region IR1 elongated along the X-direction on the common mask M, as shown in FIG. 11(a). On the other hand, the second light beams separated through the beam splitting member 7 form, for example, a circular light intensity distribution at the position of the pupil of the imaging optical system 10 or at the position of the illumination pupil near it, and then travel via the path-folding reflector 15 to form a rectangular illumination region IR2 elongated along the X-direction on the common mask M, as shown in FIG. 11(b). Namely, in the modification example of FIG. 10, the first illumination region IR1 is formed so as to cover a portion of a first pattern region PA1 of the common mask M and the second illumination region IR2 is formed so as to cover a portion of a second pattern region PA2 next along the Y-direction to the first pattern region PA1.

In this manner, in the modification example of FIG. 10, as in the case of the embodiment of FIG. 1, the first pattern image illuminated by the first illumination region IR1 is also formed in the rectangular first region ER1 elongated along the X-direction in the effective imaging region ER of the projection optical system PL and the second pattern image illuminated by the second illumination region IR2 is formed in the second region ER2 having the rectangular contour shape elongated similarly along the X-direction in the effective imaging region ER, and located in parallel in the Y-direction to the first region ER1, as shown in FIG. 5(c). The modification example of FIG. 10 achieves the maximum common optical path for guiding the two types of beams immediately after the separation by the beam splitting member 7 and thus can implement the simpler configuration and more compact form than the embodiment of FIG. 1.

Figure 12:
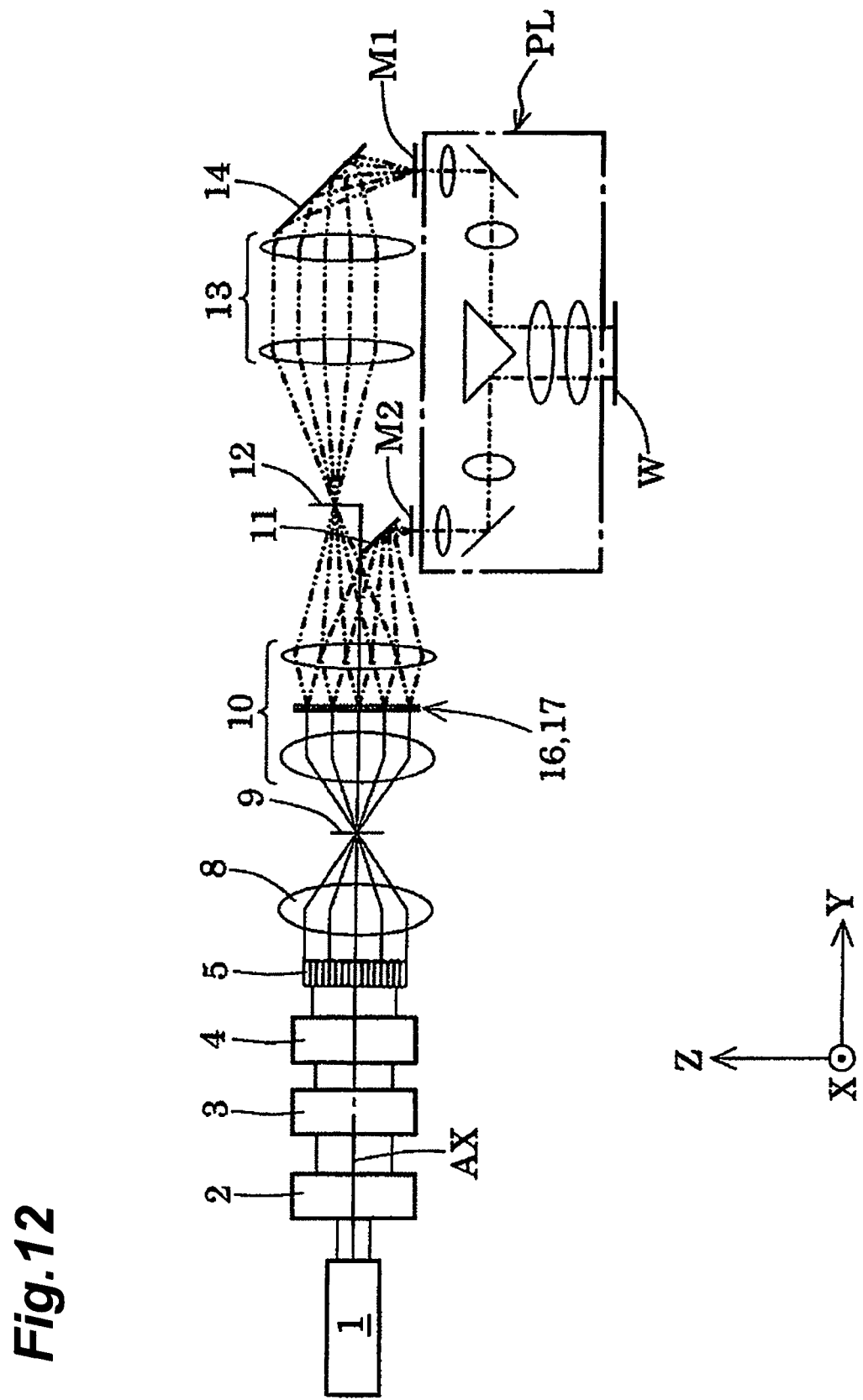
FIG. 12 is a drawing schematically showing a configuration of an exposure apparatus according to a second embodiment of the present invention.

FIG. 12 is a drawing schematically showing a configuration of an exposure apparatus according to the second embodiment of the present invention. The exposure apparatus according to the second embodiment has a configuration similar to the exposure apparatus of the embodiment of FIG. 1. However, the second embodiment is different in the arrangement and configuration of the polarization varying member and in the arrangement and configuration of the beam splitting member from the embodiment of FIG. 1. The second embodiment will be described below with focus on the differences from the embodiment of FIG. 1. In the exposure apparatus of the second embodiment, the polarization varying member 16 and beam splitting member 17 are arranged in proximity to each other, at the position of the pupil of the imaging optical system 10 or at the position of the illumination pupil near it.

Figure 13:
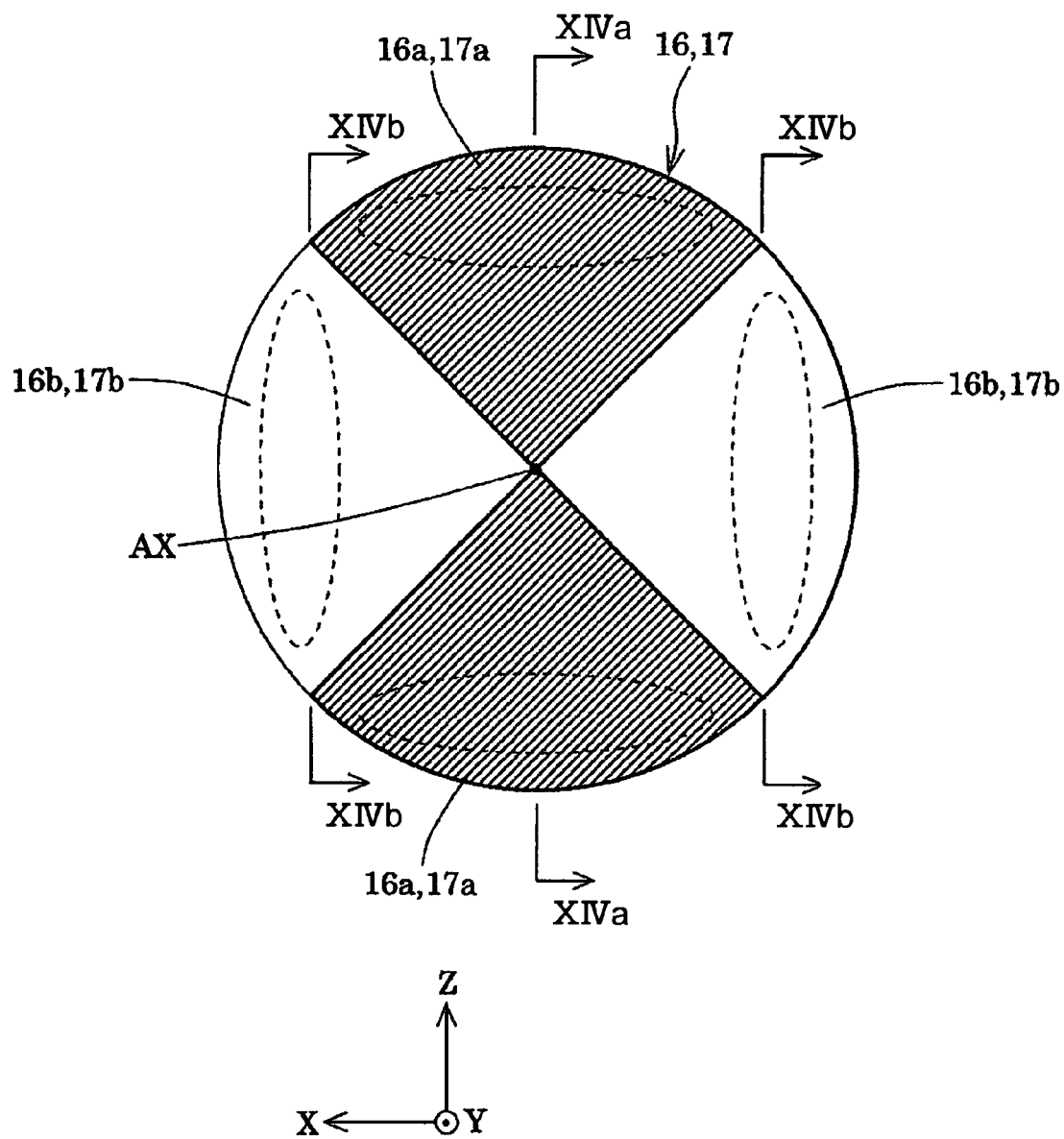
FIG. 13 is a drawing of a beam splitting member viewed along the optical axis from the exit side of an imaging optical system in the second embodiment.

FIG. 13 is a drawing of the beam splitting member viewed along the optical axis from the exit side of the imaging optical system in the second embodiment. FIG. 14 is a partial sectional view along line XIVa-XIVa and a partial sectional view along lines XIVb-XIVb. With reference to FIGS. 13 and 14, the beam splitting member 17 is composed of two folding members 17a and two folding members 17b. Specifically, the folding members 17a, 17b have forms of folding prisms, for example, made of quartz, as the folding members 7a, 7b in the embodiment of FIG. 1 did. However, the folding members 17a, 17b have a fan-shaped contour shape obtained by quartering a circle centered on the optical axis AX by two line segments passing the optical axis AX.

The first folding members 17a indicated by fan-shaped hatching regions in FIG. 13 are configured to fold rays incident along the Y-direction into the obliquely upward direction in the drawing, as shown in FIG. 14(a). On the other hand, the second folding members 17b indicated by fan-shaped outline regions in FIG. 13 are configured to fold rays incident along the Y-direction into the obliquely downward direction in the drawing, as shown in FIG. 14(b). The pair of first folding members 17a and the pair of second folding members 17b each are arranged so as to be opposed to each other with the optical axis AX in between.

The polarization varying member 16 is composed of two optical rotation members 16a and two optical rotation members 16b. The optical rotation members 16a, 16b have forms of plane-parallel plates made of rock crystal being an optical material with an optical rotatory power, as the optical rotation members 6a, 6b in the embodiment of FIG. 1 did, and the crystallographic axis thereof is set along the Y-direction. However, the optical rotation members 16a, 16b have a fan-shaped contour shape obtained by quartering a circle centered on the optical axis AX, by two line segments passing the optical axis AX, as the folding members 17a, 17b did.

Specifically, the first optical rotation members 16a indicated by fan-shaped hatching regions in FIG. 13 are arranged corresponding to the first folding members 17a as shown in FIG. 14(a), and the thickness thereof is so set that when linearly polarized light having the polarization direction along the Z-direction is incident thereto, they output linearly polarized light having the polarization direction along a direction resulting from +90° rotation of the Z-direction around the Y-axis, i.e., along the X-direction. On the other hand, the second optical rotation members 16b indicated by fan-shaped outline regions in FIG. 13 are arranged corresponding to the second folding members 17b as shown in FIG. 14(b), and the thickness thereof is so set that when linearly polarized light having the polarization direction along the Z-direction is incident thereto, they output linearly polarized light having the polarization direction along a direction resulting from +180° rotation of the Z-direction around the Y-axis, i.e., along the Z-direction. In other words, the first optical rotation members 16a have a function of converting incident vertically polarized light into horizontally polarized light, and the second optical rotation members 16b have a function of transmitting incident linearly polarized light without any change in its polarization state.

The following will explain an illustrative case in which quadrupolar light consisting of four beams of an elliptical cross section as indicated by dashed lines in FIG. 13 are incident in the Z-directional linear polarization state having the polarization direction along the Z-direction, to the polarization varying member 16, by virtue of the actions of the polarization state varying part 3 and the beam shape varying part 4. In this case, the first light beams after converted into the X-directional linear polarization state through the first optical rotation members 16a and folded into the obliquely upward direction in FIG. 12 through the first folding members 17a form a light intensity distribution of a Z-directionally dipolar shape consisting of two upper and lower beams 22a of an elliptical cross section as shown in FIG. 15 (a), at the position of the exit surface of the beam splitting member 17, i.e., at the position of the illumination pupil.

On the other hand, the second light beams after maintained in the Z-directional linear polarization state through the second optical rotation members 16b and folded into the obliquely downward direction in FIG. 12 through the second folding members 17b form a light intensity distribution of an X-directionally dipolar shape consisting of two left and right beams 22b of an elliptical cross section as shown in FIG. 15(b), at the position of the exit surface of the beam splitting member 17, i.e., at the position of the illumination pupil. In FIGS. 15(a) and (b), two-headed arrows indicate the polarization directions of light, and a circle and two line segments indicated by dashed lines correspond to the contours of the folding members 17a and 17b.

The first light beams forming the light intensity distribution of the Z-directionally dipolar shape on the pupil of the imaging optical system 10 or on the illumination pupil near it form the illumination region IR1 of the rectangular shape elongated along the X-direction on the first mask M1, as shown in FIG. 5(a). The second light beams forming the light intensity distribution of the X-directionally dipolar shape on the pupil of the imaging optical system 10 or on the illumination pupil near it form the illumination region IR2 of the rectangular shape elongated along the X-direction on the second mask M2, as shown in FIG. 5(b). Namely, in the pattern region PA1 of the first mask M1, a pattern corresponding to the first illumination region IR1 is dipolarly illuminated by the light in the X-directional linear polarization state. In the pattern region PA2 of the second mask M2, a pattern corresponding to the second illumination region IR2 is dipolarly illuminated by the light in the Y-directional linear polarization state.

In the exposure apparatus of the second embodiment of FIG. 12, as described above, while the first mask M1, the second mask M2, and the wafer W are synchronously moved along the Y-direction relative to the projection optical system PL, double scanning exposure of the pattern of the first mask M1 and the pattern of the second mask M2 is also implemented in one shot area on the wafer W to form a synthetic pattern, as in the embodiment of FIG. 1. Then the above-described double scanning exposure is repeated with two-dimensional step movement of the wafer W along the XY plane relative to the projection optical system PL, synthetic patterns of the pattern of the first mask M1 and the pattern of the second mask M2 are sequentially formed in respective shot areas on the wafer W.

In the above-described second embodiment, the polarization state of the light intensity distribution of the Z-directionally dipolar shape formed on the illumination pupil by the first light beams is set in the X-directional linear polarization state, and the polarization state of the light intensity distribution of the X-directionally dipolar shape formed on the illumination pupil by the second light beams is set in the Z-directional linear polarization state. However, without having to be limited to this, it is also feasible to implement various forms as to the polarization state of the light intensity distribution formed on the illumination pupil by the first light beams or by the second light beams, by changing the number of types of the optical rotation members constituting the polarization varying member 16, the optical rotation characteristics of the respective types of optical rotation members, the arrangement of the types of optical rotation members, the polarization state of the light incident to the polarization varying member 16, and so on. Particularly, in order to make variable the polarized illumination state being one of the illumination conditions for the respective first illumination region IR1 and second illumination region IR2, the polarization varying member 16 is preferably arranged to be replaceable with another polarization varying member for implementing a different polarized illumination state for each of the illumination regions (IR1, IR2), by a replacing device such as a turret.

In the above-described second embodiment, the first light beams and the second light beams form the light intensity distributions of the dipolar shape on the illumination pupil. However, without having to be limited to this, it is feasible to implement various forms as to the contour shape of the light intensity distributions formed on the illumination pupil by the first light beams and the second light beams, by changing the shape and arrangement of the first folding members 17a and the second folding members 17b constituting the beam splitting member 17, the sectional shape of the beams incident to the beam splitting member 17, and so on. When the light intensity distributions (illumination shape or the like) formed on the illumination pupil by the first light beams and by the second light beams are changed in order to make variable the illumination conditions in the first illumination region IR1 and in the second illumination region IR2, the beam splitting member 17 is preferably arranged to be replaceable with another beam splitting member for implementing a different illumination condition state for each of the illumination regions (IR1, IR2), by a replacing device such as a turret.

In the foregoing second embodiment, the beam splitting member 17 is composed of the two types of folding members 17a and 17b. However, without having to be limited to this, the same operational effect as in the aforementioned second embodiment can also be achieved, for example, by use of a beam splitting member 17' substantially comprised of a pair of fan-shaped first folding members 17a and a polarization varying member 16' comprised of a pair of fan-shaped first optical rotation members 16a.

Figure 16:
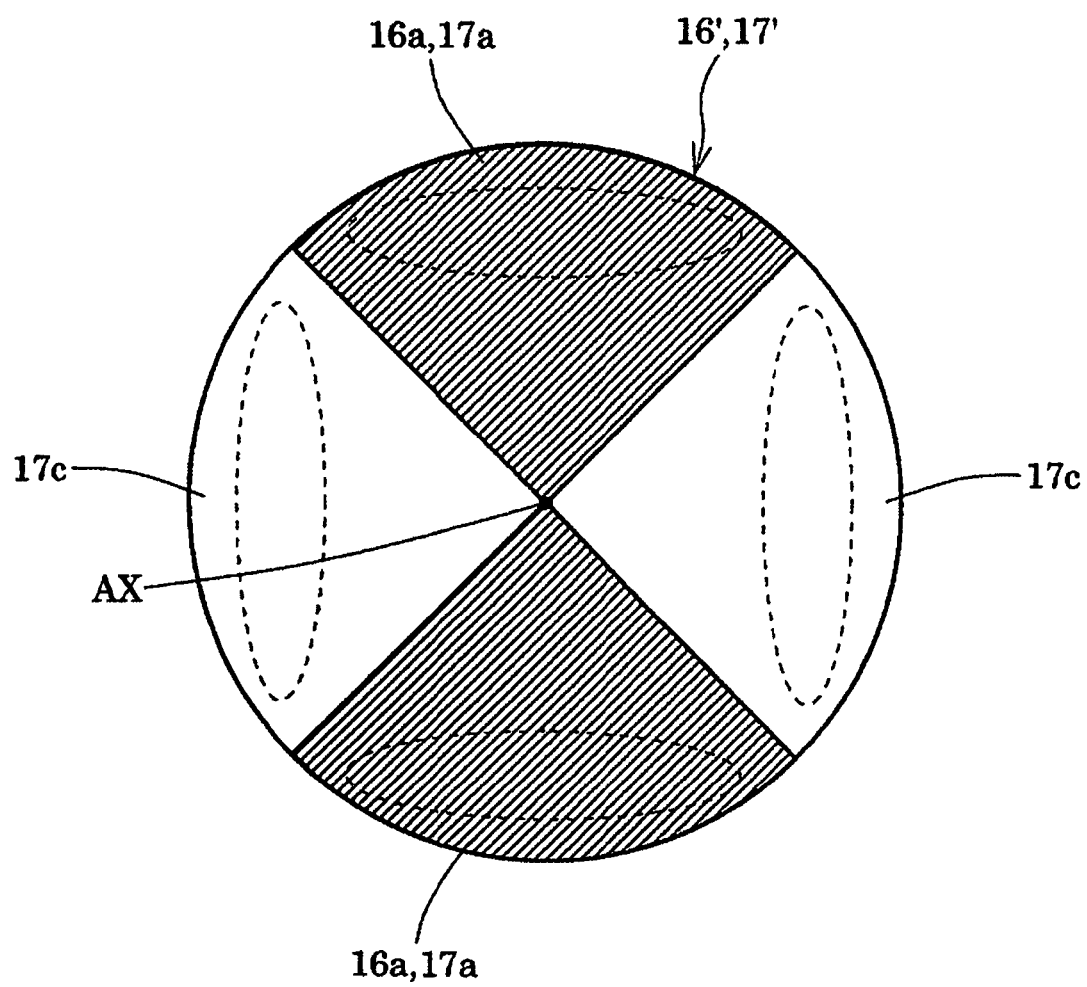
FIG. 16 is a drawing schematically showing a configuration of a beam splitting member and a polarization varying member according to a modification example of the second embodiment.

FIG. 16 is a drawing schematically showing a configuration of a beam splitting member and a polarization varying member according to a modification example of the second embodiment. In the beam splitting member 17' shown in FIG. 16, a pair of first folding members 17a indicated by fan-shaped hatching regions are arranged to fold rays incident along the Y-direction, into the obliquely upward direction in FIG. 12, and a pair of optically transparent portions 17c indicated by fan-shaped outline regions are arranged to transmit rays incident along the Y-direction, without folding. On the other hand, the polarization varying member 16' is comprised of a pair of fan-shaped first optical rotation members 16a arranged so as to correspond to the pair of first folding members 17a.

In the modification example of FIG. 16, the first light beams after converted from the Z-directional linear polarization state into the X-directional linear polarization state through the first optical rotation members 16a and folded into the obliquely upward direction in FIG. 12 through the first folding members 17a form a light intensity distribution of a Z-directionally dipolar shape consisting of two upper and lower beams 22a having an elliptical cross section as shown in FIG. 15(a), at the position of the exit surface of the beam splitting member 17', i.e., at the position of the illumination pupil. On the other hand, the second light beams after having traveled straight through the optically transparent portions 17c while being maintained in the Z-directional linear polarization state form a light intensity distribution of an X-directionally dipolar shape consisting of two left and right beams 22b having an elliptical cross section as shown in FIG. 15(b), at the position of the exit surface of the beam splitting member 17', i.e., at the position of the illumination pupil.

In the modification example of FIG. 16, as arranged in this manner, the first light beams forming the light intensity distribution of the Z-directionally dipolar shape on the pupil of the imaging optical system 10 or on the illumination pupil near it, also form the illumination region IR1 of the rectangular shape elongated along the X-direction on the first mask M1, as shown in FIG. 5(a), as in the second embodiment. Furthermore, the second light beams forming the light intensity distribution of the X-directionally dipolar shape on the pupil of the imaging optical system 10 or on the illumination pupil near it, also form the illumination region IR2 of the rectangular shape elongated along the X-direction on the second mask M2, as shown in FIG. 5(b).

In the modification example of FIG. 16, the polarization varying member 16' is composed of the pair of fan-shaped first optical rotation members 16a, but, without having to be limited to this, a pair of fan-shaped second optical rotation members 16b may also be additionally provided so as to correspond to the pair of fan-shaped optically transparent portions 17c. Furthermore, it is also feasible to implement various forms as to the polarization state of the light intensity distribution formed on the illumination pupil by the first light beams or by the second light beams, by changing the number of types of optical rotation members constituting the polarization varying member 16', the optical rotation characteristics of the respective types of optical rotation members, the arrangement of the types of optical rotation members, the polarization state of the light incident to the polarization varying member 16', and so on.

Figure 17:
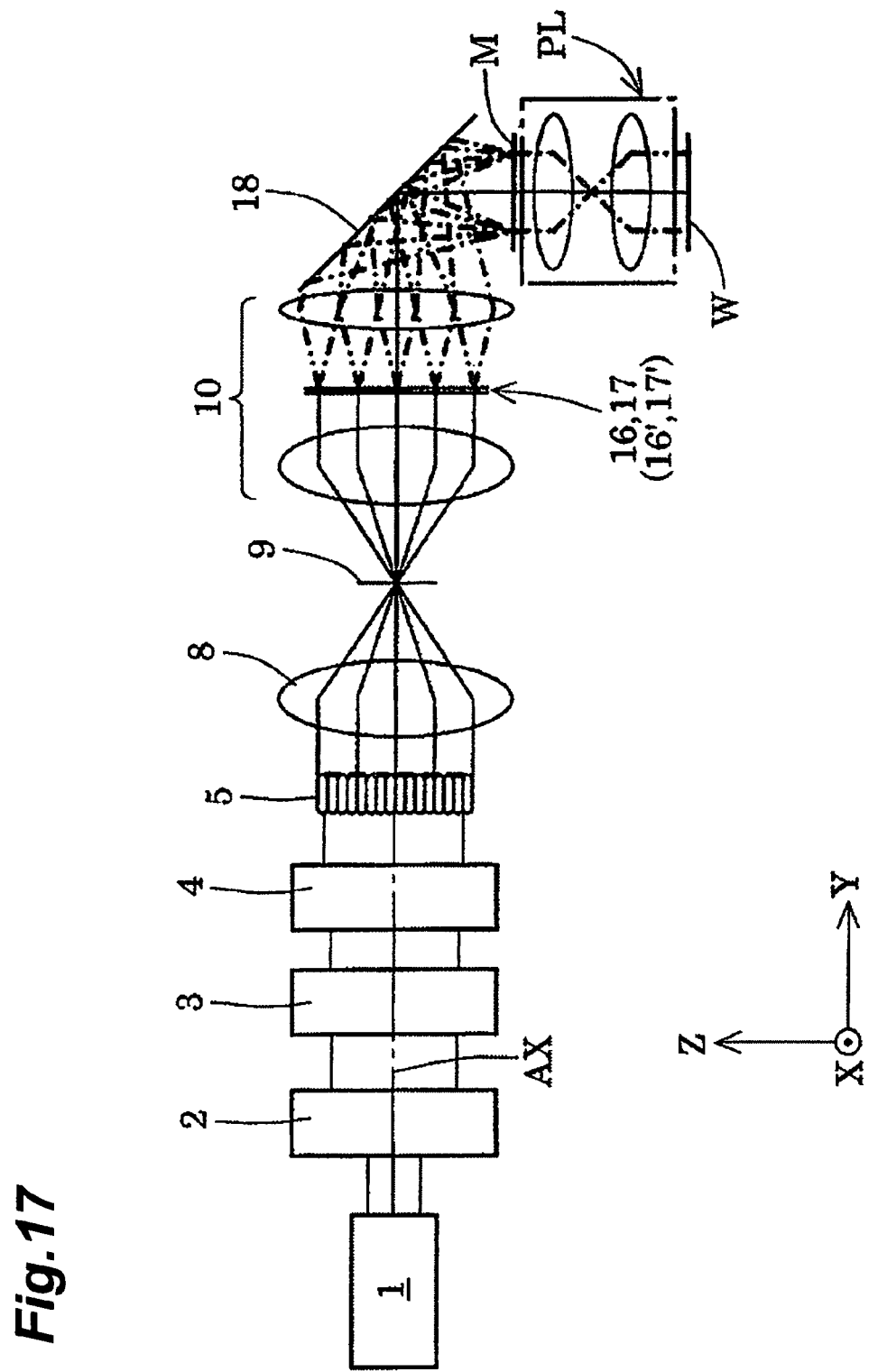
FIG. 17 is a drawing schematically showing a configuration of an exposure apparatus according to a modification example of the second embodiment.

In the above-described second embodiment, the first light beams form the first illumination region IR1 on the first mask M1 and the second light beams form the second illumination region IR2 on the second mask M2, as in the first embodiment. However, without having to be limited to this, it is also possible to adopt a modification example of the exposure apparatus in which the first illumination region IR1 formed by the first light beams and the second illumination region IR2 formed by the second light beams are arranged in parallel on a common mask. FIG. 17 is a drawing schematically showing a configuration of an exposure apparatus according to a modification example of the second embodiment.

The exposure apparatus according to the modification example of FIG. 17 has a configuration similar to the exposure apparatus of the embodiment shown in FIG. 12. However, the modification example of FIG. 17 is basically different from the embodiment of FIG. 12 in that a path-folding reflector 18 for reflecting the first light beams and the second light beams having passed through the imaging optical system 10, toward the common mask M is provided immediately after the imaging optical system 10 and in that, for example, an ordinary refracting optical system is used as the projection optical system PL. The modification example of FIG. 17 will be described below with focus on the differences from the embodiment of FIG. 12.

In the modification example of FIG. 17, the first light beams separated through the beam splitting member 17 (17') form, for example, a light intensity distribution of a dipolar shape at the position of the pupil of the imaging optical system 10 or at the position of the illumination pupil near it, and then travel via the path-folding reflector 18 to form the illumination region IR1 of the rectangular shape elongated along the X-direction on the common mask M, as shown in FIG. 11(a). On the other hand, the second light beams separated through the beam splitting member 17 (17') form, for example, a light intensity distribution of a dipolar shape at the position of the pupil of the imaging optical system 10 or at the position of the illumination pupil near it, and then travel via the path-folding reflector 18 to form the illumination region IR2 of the rectangular shape elongated along the X-direction on the common mask M, as shown in FIG. 11(b). In this manner, the first illumination region IR1 is also formed so as to cover a portion of the first pattern region PA1 of the common mask M and the second illumination region IR2 is also formed so as to cover a portion of the second pattern region PA2 next along the Y-direction to the first pattern region PA1 in the modification example of FIG. 17 as in the modification example of FIG. 10.

Figure 18:
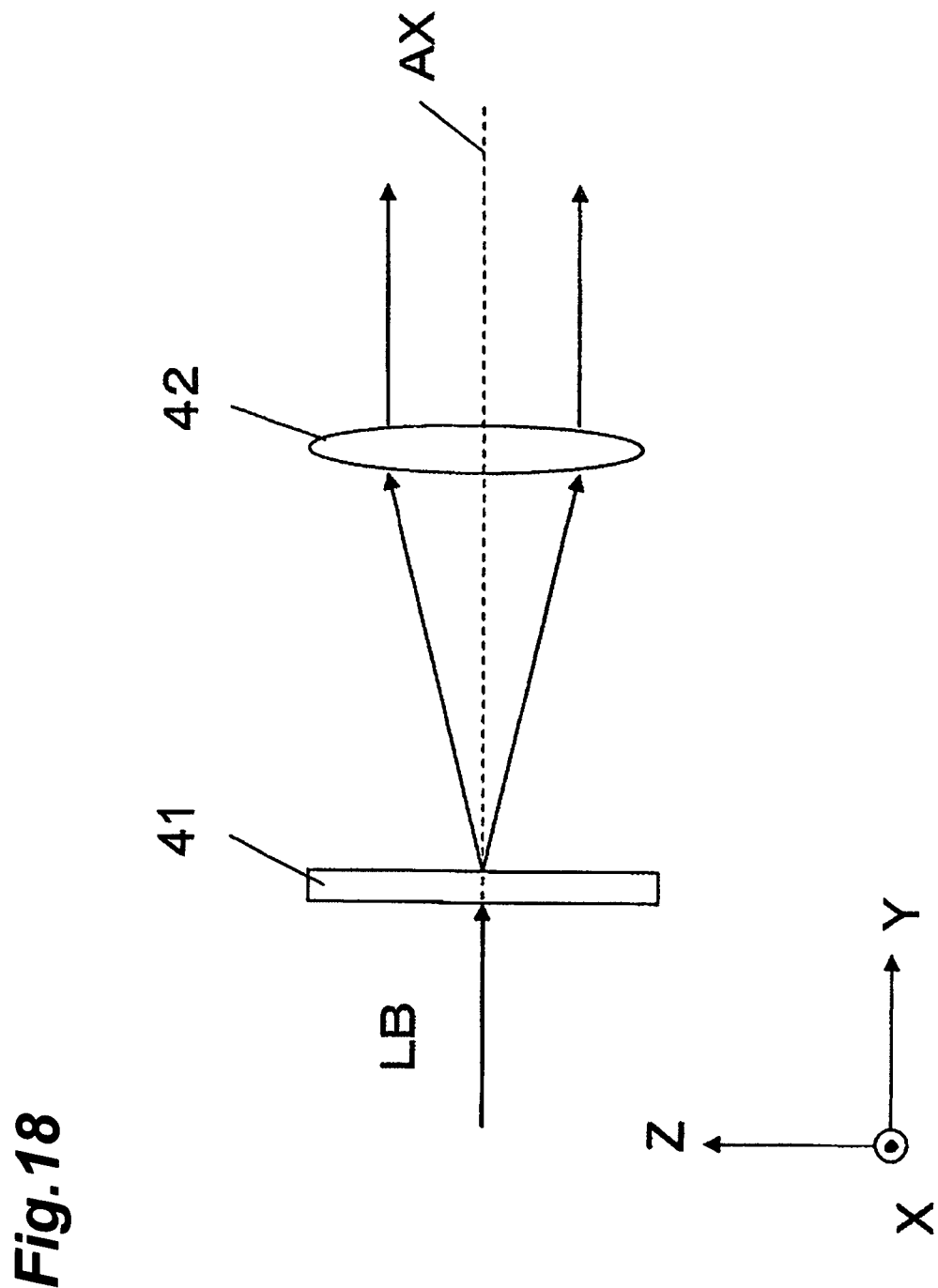
FIG. 18 is a drawing showing a state of a configuration of a beam shape varying member 4.

Incidentally, the embodiment shown in FIGS. 12-16 is arranged to illuminate the first illumination region IR1 on the first mask M1 and the second illumination region IR2 on the second mask M2 under the predetermined illumination conditions different from each other, but it is also possible to vary the illumination conditions in the two illumination regions. FIG. 18 is a drawing showing a configuration of a beam shape varying part 4 functioning as a varying means (varying member) for independently varying each of the illumination conditions in the first illumination region IR1 and in the second illumination region IR2. As shown in FIG. 18, the beam shape varying part 4 has a diffractive optical element 41 and a power-varying optical system 42, and the diffractive optical element 41 is arranged to be replaceable with another diffractive optical element for implementing another illumination condition for each illumination region (IR1, IR2), by a replacing device such as a turret.

The diffractive optical element 41, for example as shown in FIG. 19(a), has a first diffraction region 41A and a second diffraction region 41B. A light beam LB illuminating the first diffraction region 41A is diffracted by this first diffraction region 41A to form a light intensity distribution of a Z-directionally dipolar shape consisting of two upper and lower beams (LB1, LB2) having a fan-shaped cross section as shown in FIG. 19(b), at the position of the exit surface of the beam splitting member 17, i.e., at the position of the illumination pupil. At this time, the light intensity distribution of the Z-directionally dipolar shape is converted into X-directionally linearly polarized light by the first optical rotation members 16a (cf. FIGS. 13 and 14) in the polarization varying member 16 as a polarization varying means, as shown in FIG. 19(b). Then a pattern corresponding to the first illumination region IR1 of the first mask M1 is dipolarly illuminated by the light in the X-directional linear polarization state (light having the fan-shaped cross section on the illumination pupil).

Figure 19:
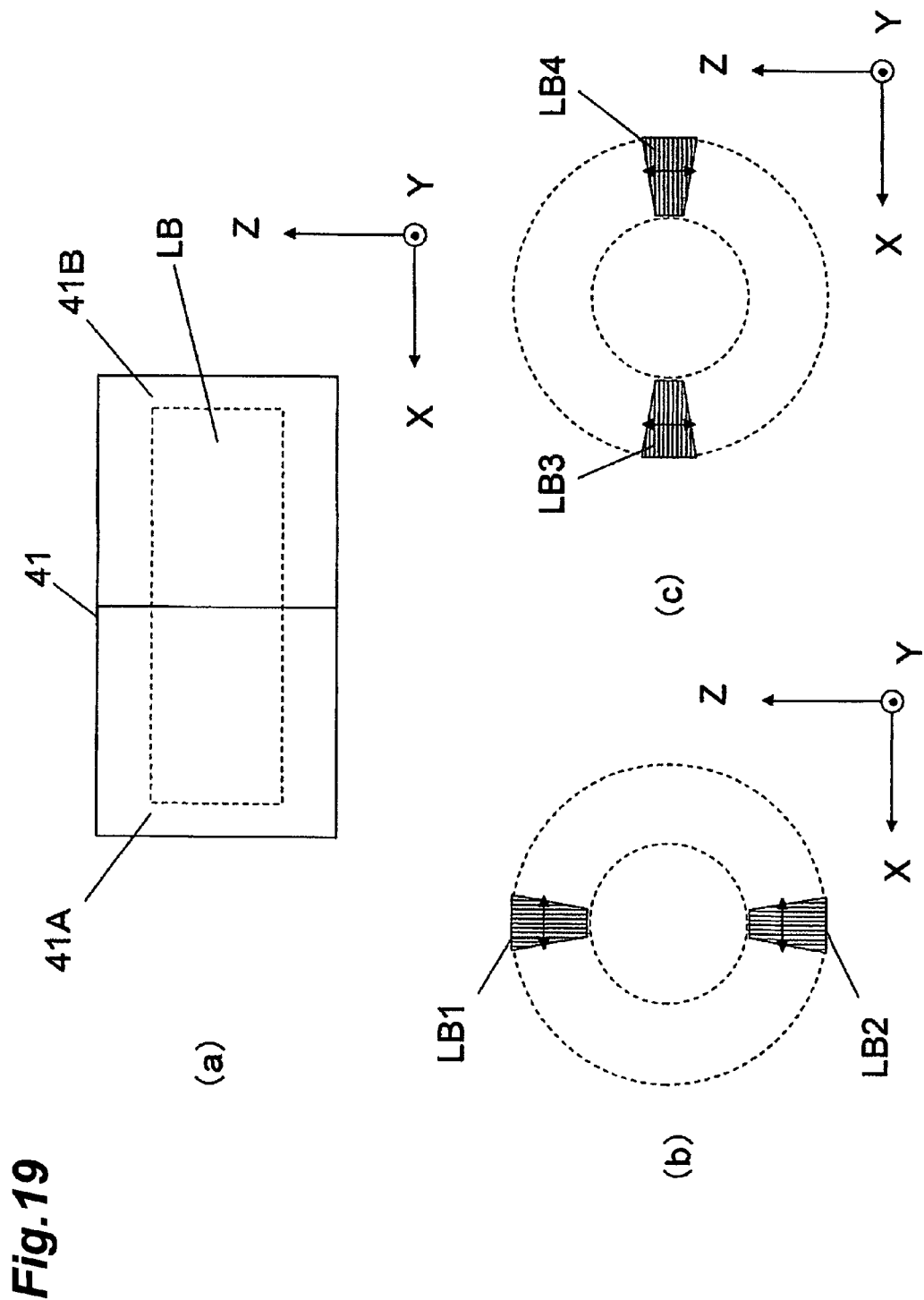
FIG. 19 is a drawing showing a configuration of a diffractive optical element 41, a light intensity distribution formed on the illumination pupil by a first diffraction region 41A of the diffractive optical element 41, and a light intensity distribution formed on the illumination pupil by a second diffraction region 41B of the diffractive optical element 41 (region (a) shows the configuration of the diffractive optical element 41, region (b) the light intensity distribution formed on the illumination pupil by the first diffraction region 41A of the diffractive optical element 41, and region (c) the light intensity distribution formed on the illumination pupil by the second diffraction region 41B of the diffractive optical element 41).

The light beam LB illuminating the second diffraction region 41B is diffracted by this second diffraction region 41B to form a light intensity distribution of an X-directionally dipolar shape consisting of two left and right beams (LB3, LB4) having a fan-shaped cross section as shown in FIG. 19(c), at the position of the exit surface of the beam splitting member 17, i.e., at the position of the illumination pupil. At this time, the light intensity distribution of the X-directionally dipolar shape is converted into Z-directionally linearly polarized light by the second optical rotation members 16b (cf. FIGS. 13 and 14) in the polarization varying member 16 as a polarization varying means, as shown in FIG. 19 (c). Then a pattern corresponding to the second illumination region IR2 of the second mask M2 is dipolarly illuminated by the light in the Y-directional linear polarization state (light having the fan-shaped cross section on the illumination pupil).

Here the change in the respective illumination conditions in the first illumination region IR1 and in the second illumination region IR2 is achieved by replacement of the diffractive optical element 41 shown in FIG. 18, or by the power-varying optical system 42. First, the diffractive optical element 41 is replaced with another diffractive optical element 141 for implementing different illumination conditions for the respective illumination regions (IR1, IR2) by the replacing device such as a turret. The diffractive optical element 141, for example as shown in FIG. 20(a), has a first diffraction region 141A and a second diffraction region 141B. The light beam LB illuminating the first diffraction region 141A is diffracted by this first diffraction region 141A to form a light intensity distribution of a Z-directionally dipolar shape consisting of two upper and lower beams (LB11, LB12) having a circular cross section as shown in FIG. 20(b), at the position of the exit surface of the beam splitting member 17, i.e., at the position of the illumination pupil.

At this time, the light intensity distribution of the Z-directionally dipolar shape is converted into X-directionally linearly polarized light by the first optical rotation members 16a (cf. FIGS. 13 and 14) in the polarization varying member 16, as shown in FIG. 20(b). Then a pattern corresponding to the first illumination region IR1 of the first mask M1 is dipolarly illuminated by the light in the X-directional linear polarization state (light having the circular cross section on the illumination pupil). In this case, since the sectional shape of light on the illumination pupil in the dipolar illumination is different from that in the case where the diffractive optical element 41 is disposed in the optical path, the pattern corresponding to the first illumination region IR1 of the first mask M1 is illuminated under a different illumination condition.

Furthermore, the light beam LB illuminating the second diffraction region 141B of the diffractive optical element 141 is diffracted by this second diffraction region 141B to form a light intensity distribution of an X-directionally dipolar shape consisting of two left and right beams (LB13, LB14) having a circular cross section as shown in FIG. 20(c), at the position of the exit surface of the beam splitting member 17, i.e., at the position of the illumination pupil. At this time, the light intensity distribution of the X-directionally dipolar shape is converted into Z-directionally linearly polarized light by the second optical rotation members 16b (cf. FIGS. 13 and 14) in the polarization varying member 16, as shown in FIG. 20(c). Then a pattern corresponding to the second illumination region IR2 of the second mask M2 is dipolarly illuminated by the light in the Y-directional linear polarization state (light having the circular cross section on the illumination pupil). In this case, since the sectional shape of light on the illumination pupil in the dipolar illumination is different from that in the case where the diffractive optical element 41 is disposed in the optical path, the pattern corresponding to the second illumination region IR2 of the second mask M2 is illuminated under a different illumination condition.

Next, the change in the illumination conditions by the power-varying optical system 42 can be implemented by moving a plurality of movable lenses forming the power-varying optical system 42, along the optical axis AX. Namely, the change in the illumination conditions in the first illumination region IR1 and in the second illumination region IR2 can be implemented by moving the plurality of lenses along the optical axis AX to enlarge or reduce the light intensity distributions formed on the illumination pupil as shown in FIG. 19 and FIG. 20.

Figure 20:
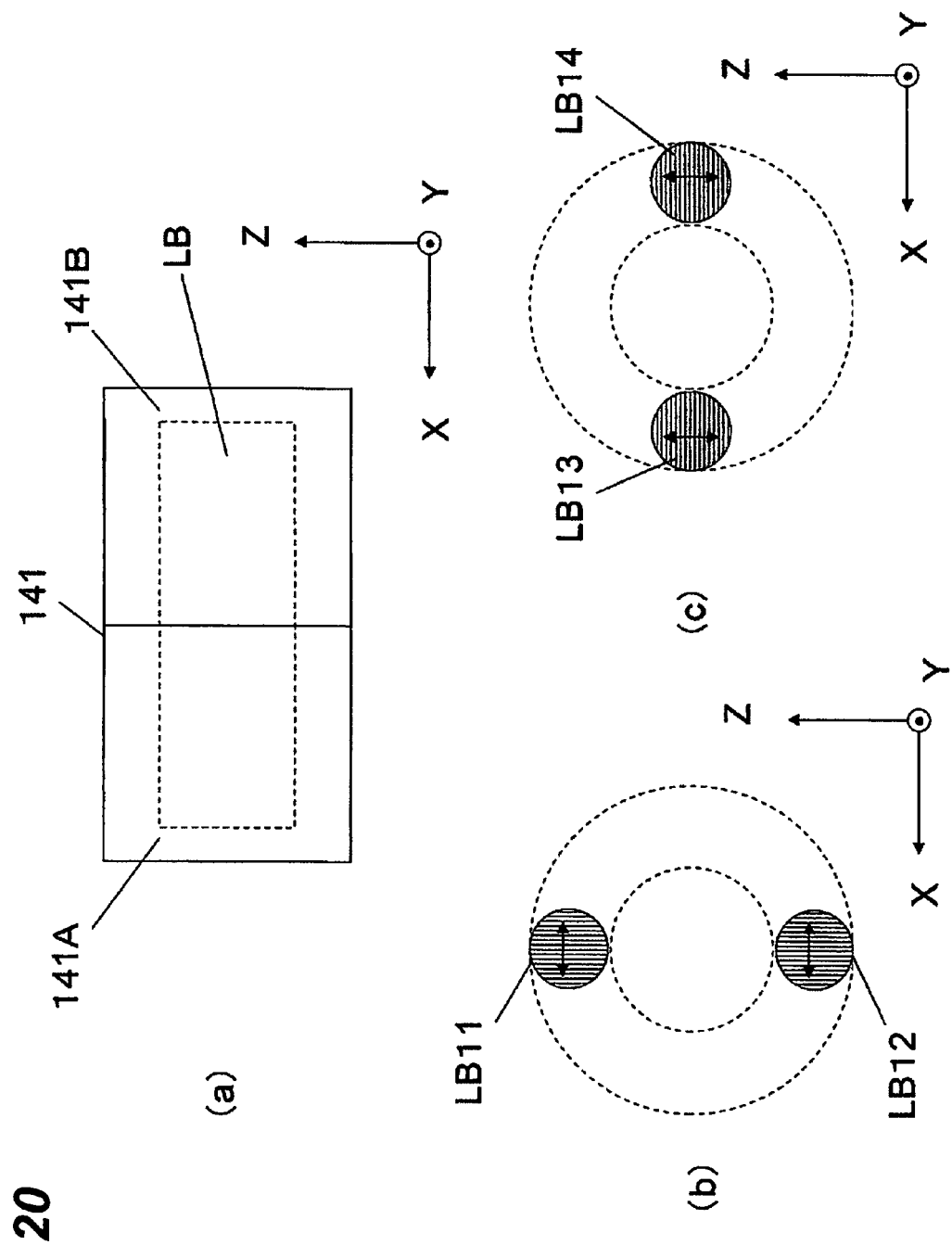
FIG. 20 is a drawing showing a configuration of a diffractive optical element 141, a light intensity distribution formed on the illumination pupil by a first diffraction region 141A of the diffractive optical element 141, and a light intensity distribution formed on the illumination pupil by a second diffraction region 141B of the diffractive optical element 141 (region (a) shows the configuration of the diffractive optical element 141, region (b) the light intensity distribution formed on the illumination pupil by the first diffraction region 141A of the diffractive optical element 141, and region (c) the light intensity distribution formed on the illumination pupil by the second diffraction region 141B of the diffractive optical element 141).

It is needless to mention that the configurations of FIGS. 18-20 are applicable without modification to the embodiment shown in FIG. 17. It is also a matter of course that the embodiments shown above in FIGS. 1-11 may be arranged to effect the replacement of the diffractive optical element 41 in the beam shape varying part 4 and/or the power variation of the power-varying optical system 42, as shown in FIG. 18, for implementing the change in the illumination conditions. The embodiment shown in FIGS. 1 to 6 can be configured so that the diffractive optical element 41 for forming the desired light intensity distributions on the illumination pupil is replaceable for the change in the illumination conditions.

The embodiment shown in FIGS. 7-9 illustrates the example in which the diffractive optical element for forming the circular beams for achievement of circular illumination is located in the beam shape varying part 4, but a diffractive optical element having a first diffraction region for forming an annular beam for achievement of desired annular illumination, and a second diffraction region for forming a circular beam for achievement of circular illumination may be used as a diffractive optical element to be located in the beam shape varying part 4, as shown in FIGS. 19 and 20. This can achieve the change in the illumination conditions in the first illumination region IR1 and in the second illumination region IR2.

Figure 21:
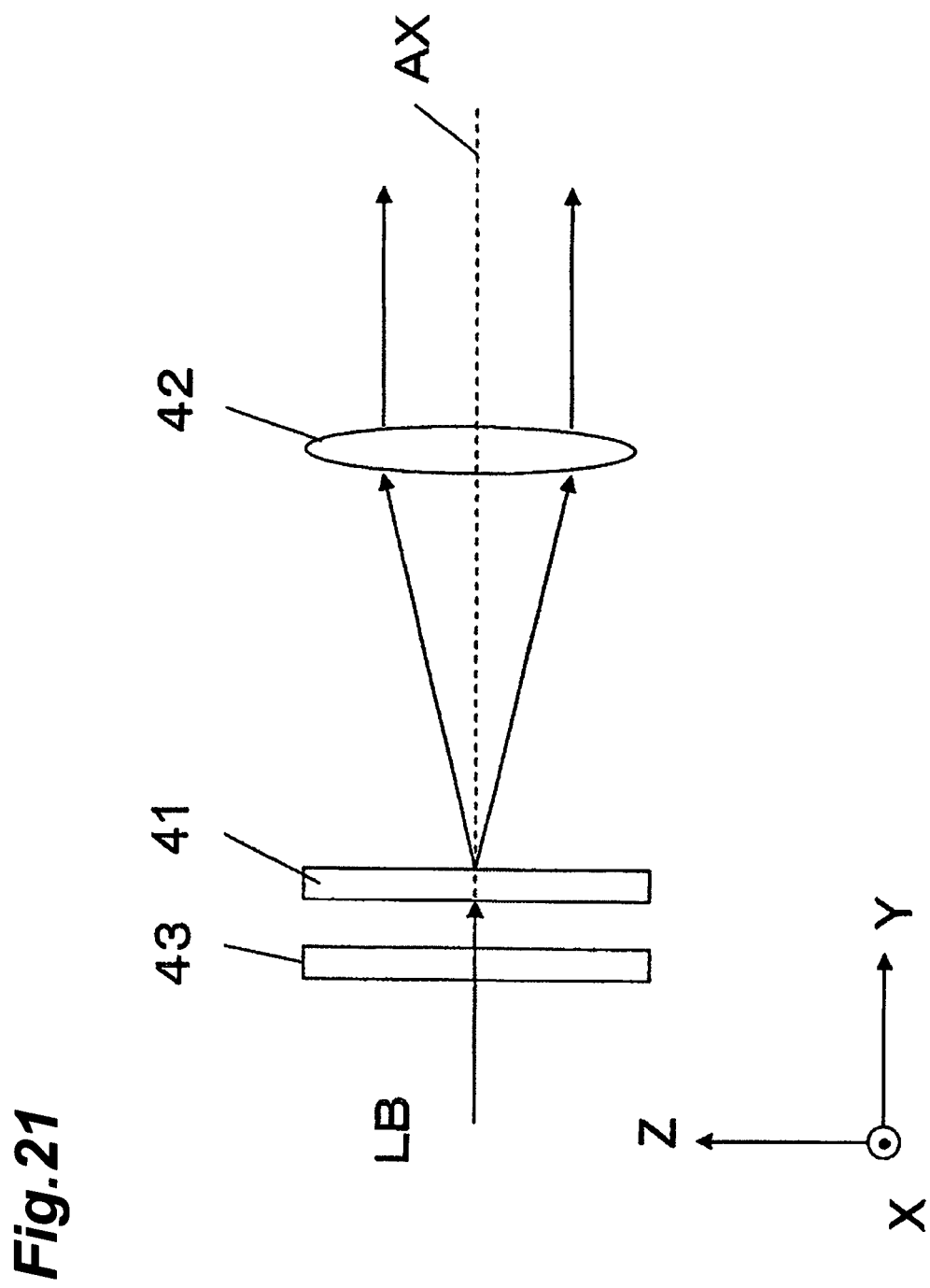
FIG. 21 is a drawing showing a state of a configuration of a beam shape varying member 4 according to a modification example.
Figure 22:
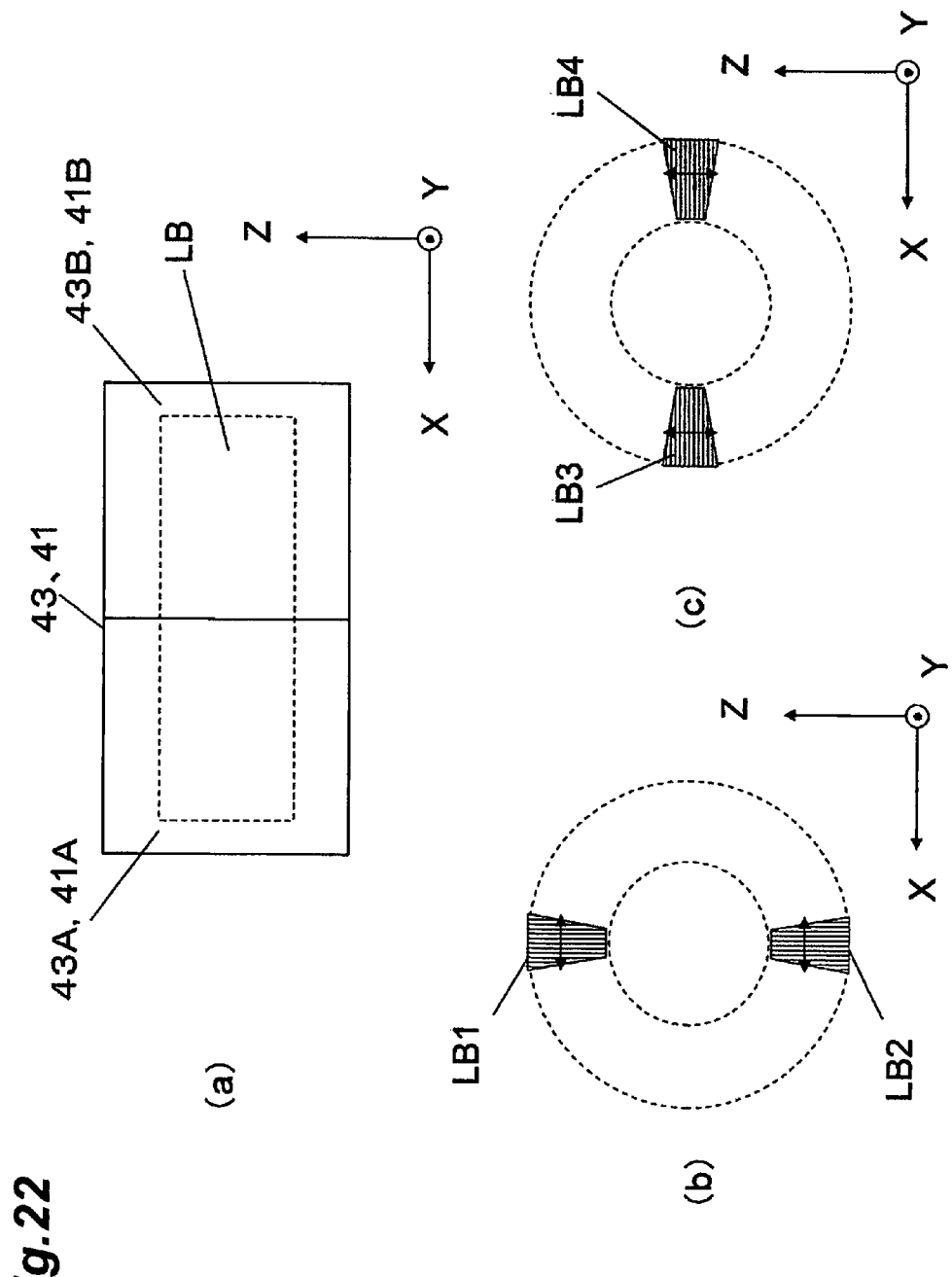
FIG. 22 is a drawing showing a configuration of a diffractive optical element 41 and a polarization varying member 43, a light intensity distribution formed on the illumination pupil by a first diffraction region 41A of the diffractive optical element 41, and a light intensity distribution formed on the illumination pupil by a second diffraction region 41B of the diffractive optical element 41 (region (a) shows the configuration of the diffractive optical element 41 and the polarization varying member 43, region (b) the light intensity distribution formed on the illumination pupil by the first diffraction region 41A of the diffractive optical element 41, and region (c) the light intensity distribution formed on the illumination pupil by the second diffraction region 41B of the diffractive optical element 41).

Incidentally, the modification example of the embodiment shown in FIGS. 18-20 can also be configured as shown in FIGS. 21 and 22. In this case, the polarization varying member 16 in each embodiment shown in FIGS. 12-16 is preferably configured simply as an optically transparent member. In FIG. 21, a polarization varying member 43 is located on the entrance side of the diffractive optical element 41 in FIG. 18, and this polarization varying member 43 is comprised of a polarizing element or an optical rotation element.

Here the polarization varying member 43, as shown in FIG. 22 (a), has a first polarization varying region 43A corresponding to the first diffraction region 41A of the diffractive optical element 41, and a second polarization varying region 43B corresponding to the second diffraction region 41B of the diffractive optical element 41. The light beam LB illuminating the first polarization varying region 43A is converted into linearly polarized light in an X-directionally polarized state by polarizing action in this first polarization varying region 43A. Thereafter, this linearly polarized light is diffracted by the first diffraction region 41A to form a light intensity distribution of a Z-directionally dipolar shape consisting of two upper and lower beams (LB1, LB2) having a fan-shaped cross section as shown in FIG. 22(b), at the position of the exit surface of the beam splitting member 17, i.e., at the position of the illumination pupil. Then a pattern corresponding to the first illumination region IR1 of the first mask M1 is dipolarly illuminated by the light in the X-directional linear polarization state (light having the fan-shaped cross section on the illumination pupil).

Furthermore, the light beam LB illuminating the second polarization varying region 43B is converted into linearly polarized light in a Z-directionally polarized state by polarizing action in this second polarization varying region 43B. Thereafter, this linearly polarized light is diffracted by the second diffraction region 41B to form a light intensity distribution of an X-directionally dipolar shape consisting of two left and right beams (LB3, LB4) having a fan-shaped cross section as shown in FIG. 22(c), at the position of the exit surface of the beam splitting member 17, i.e., at the position of the illumination pupil. Then a pattern corresponding to the second illumination region IR2 of the second mask M2 is dipolarly illuminated by the light in the Y-directional linear polarization state (light having the fan-shaped cross section on the illumination pupil).

The modification example shown in FIGS. 21 and 22 illustrates the example in which the polarization varying member 43 is located on the entrance side of the diffractive optical element 41, but it is also possible to locate the polarization varying member 43 on the exit side of the diffractive optical element 41. It is also possible to make the first diffraction region and the second diffraction region of the diffractive optical element 41 of an optical rotation material such as rock crystal and in their respective predetermined thicknesses and to make the diffractive optical element 41 also function as the polarization varying member 43.

In each of the above-described embodiments and modification examples, the polarization varying member is composed of the optical rotation member, but, without having to be limited to this, the polarization varying member can also be composed, for example, of a wave plate. In addition, in each of the foregoing embodiments and modification examples, the polarization varying member is located immediately before the beam splitting member, but, without having to be limited to this, it is also possible to adopt a variety of forms as to the arrangement of the polarization varying member and the beam splitting member.

In each of the embodiments shown in FIGS. 18-22, in order to make variable the polarized illumination states being one of the illumination conditions for each of the first illumination region IR1 and the second illumination region IR2, the polarization varying member 16 is preferably arranged to be replaceable with another polarization varying member for implementing a different polarized illumination state for each of the illumination regions (IR1, IR2), by a replacing device such as a turret. When the light intensity distributions (illumination shape or the like) formed on the illumination pupil by the first light beams and by the second light beams are changed in order to vary the illumination conditions in the first illumination region IR1 and in the second illumination region IR2, the beam splitting member 17 is preferably arranged to be replaceable with another beam splitting member for implementing a different illumination condition state for each of the illumination regions (IR1, IR2), by a replacing device such as a turret.

Each of the foregoing embodiments and modification examples describes the embodiment in association with the double exposure to form a synthetic pattern by double printing of two types of patterns in one shot area on the photosensitive substrate (wafer). However, without having to be limited to this, the foregoing embodiments and modification examples are also applicable similarly to multiple exposure to form a synthetic pattern by multiple printing of three or more types of patterns in one shot area on the photosensitive substrate.

In each of the foregoing embodiments and modification examples, a synthetic pattern is formed in one shot area on the photosensitive substrate by double scanning exposure of the first pattern and the second pattern. However, without having to be limited to this, it is also possible to implement the following exposure: scanning exposure or full-field exposure of the first pattern is effected in a first shot area on the photosensitive substrate, and scanning exposure or full-field exposure of the second pattern is effected in a second shot area on the photosensitive substrate.

In each of the foregoing embodiments and modification examples, the pattern image of the first illumination region of the first mask and the pattern image of the second illumination region of the second mask are formed in parallel on the photosensitive substrate. However, without having to be limited to this, a synthetic pattern can also be formed in one shot area on the photosensitive substrate by double scanning exposure or full-field exposure of the first pattern and the second pattern, using the projection optical system for forming the pattern image of the first illumination region of the first mask and the pattern image of the second illumination region of the second mask in accord with each other on the photosensitive substrate.

In the embodiment of FIG. 1 and the embodiment of FIG. 12, one projection optical system is used to effect exposure of the patterns on the two masks on one photosensitive substrate. However, without having to be limited to this, it is also possible to effect exposure of the mask patterns on corresponding photosensitive substrates, using a pair of (generally, a plurality of) projection optical systems.

Figure 23:
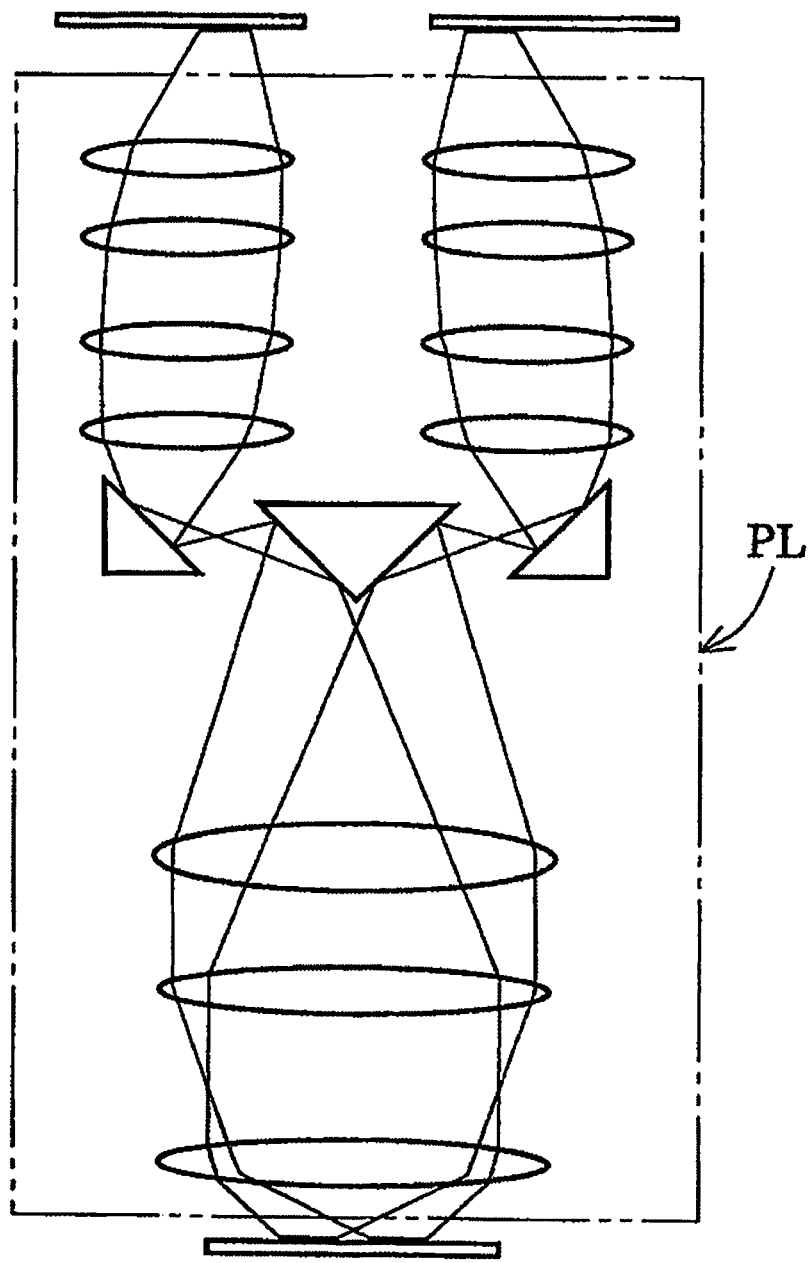
FIG. 23 is a drawing schematically showing a configuration of a double-headed projection optical system consisting of refracting systems and folding mirrors.
Figure 24:
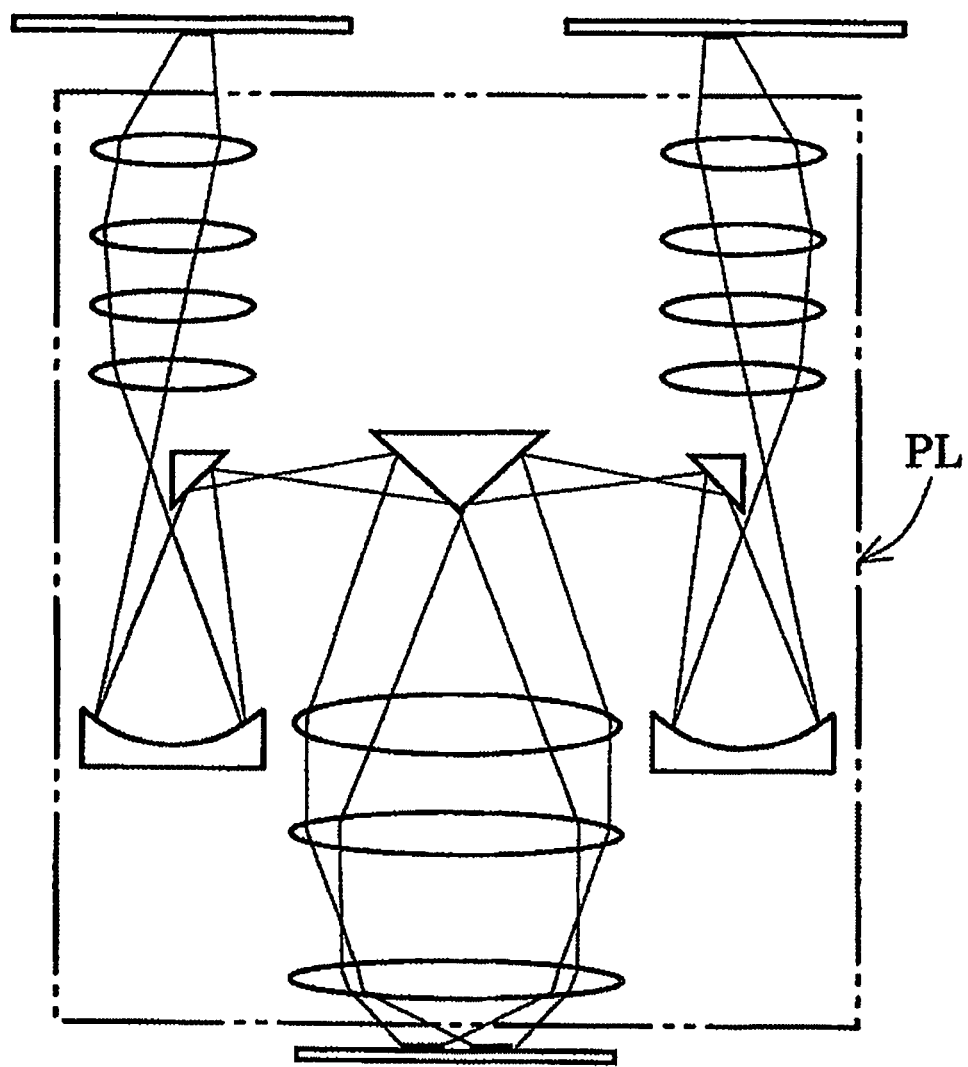
FIG. 24 is a drawing schematically showing a configuration of a catadioptric and double-headed projection optical system.
Figure 25:
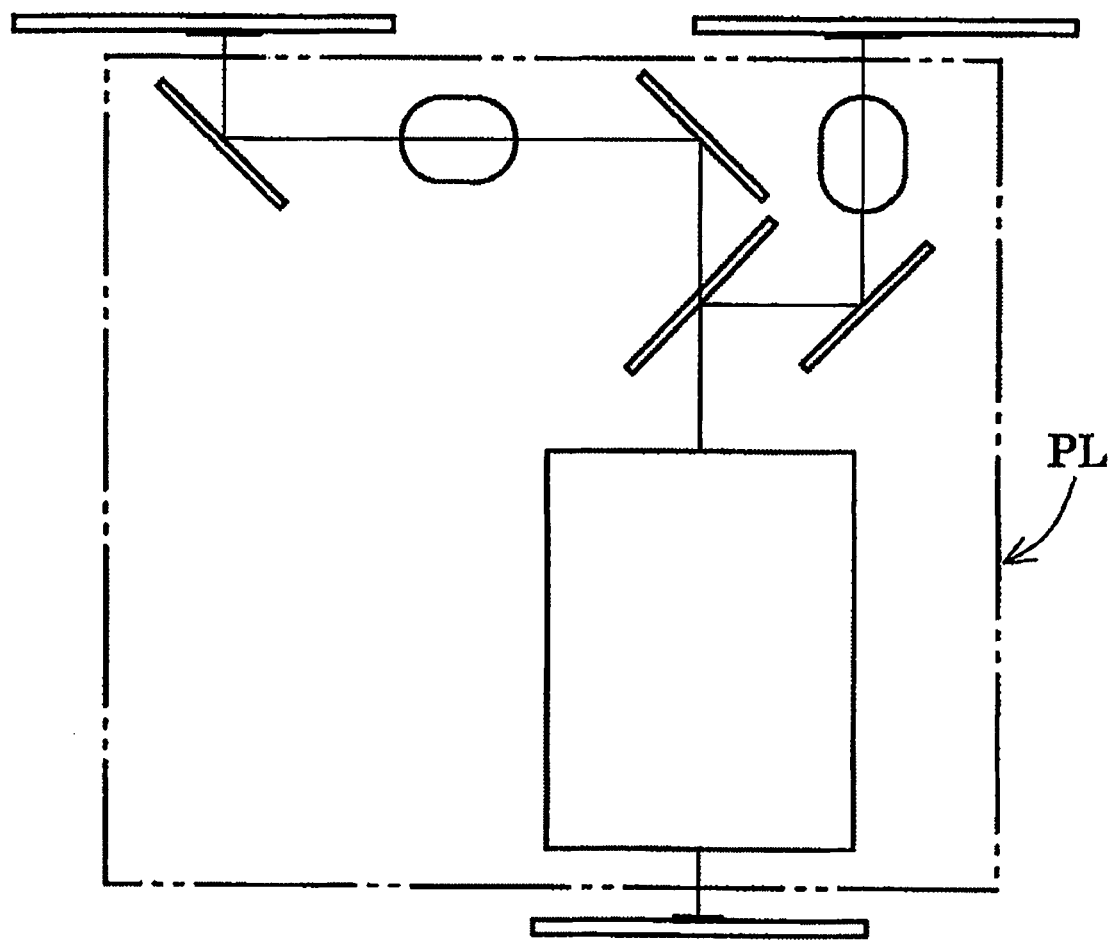
FIG. 25 is a drawing schematically showing a configuration of a double-headed projection optical system using a beam splitter.

The embodiment of FIG. 1 and the embodiment of FIG. 12 use the double-headed projection optical system consisting of refracting systems and folding mirrors. However, without having to be limited to this, it is also possible, for example, to use a double-headed projection optical system PL of another type consisting of refracting systems and folding mirrors as shown in FIG. 23, or a catadioptric and double-headed projection optical system PL as shown in FIG. 24. It is also possible to use a double-headed projection optical system PL using a beam splitter as shown in FIG. 25, as a projection optical system for forming the pattern image of the first mask and the pattern image of the second mask in accord with each other on the photosensitive substrate.

In each of the above embodiments, all the optical systems located on the optical path from the light source to the beam splitting member are the common optical systems, and the optical systems (condenser optical system and imaging optical system) located on the optical path from the beam splitting member to the surfaces to be illuminated (first and second illumination regions) can be constructed as common optical systems at least in part. Furthermore, it is also possible to guide the beams separated by the beam splitting member, to the respective surfaces to be illuminated (first and second illumination regions), by respective independent optical systems.

The exposure apparatus of the foregoing embodiments can be used to manufacture micro devices (semiconductor devices, image pickup devices, liquid-crystal display devices, thin-film magnetic heads, etc.) by illuminating masks (reticles) by the illumination optical apparatus (illumination step) and projecting patterns to be transferred, formed in the masks, onto a photosensitive substrate through the projection optical system to effect exposure thereof (exposure step). An example of a technique of manufacturing semiconductor devices as micro devices by forming a predetermined circuit pattern in the wafer or the like as a photosensitive substrate by means of the exposure apparatus of the present embodiment will be described below with reference to the flowchart of FIG. 26.

Figure 26:
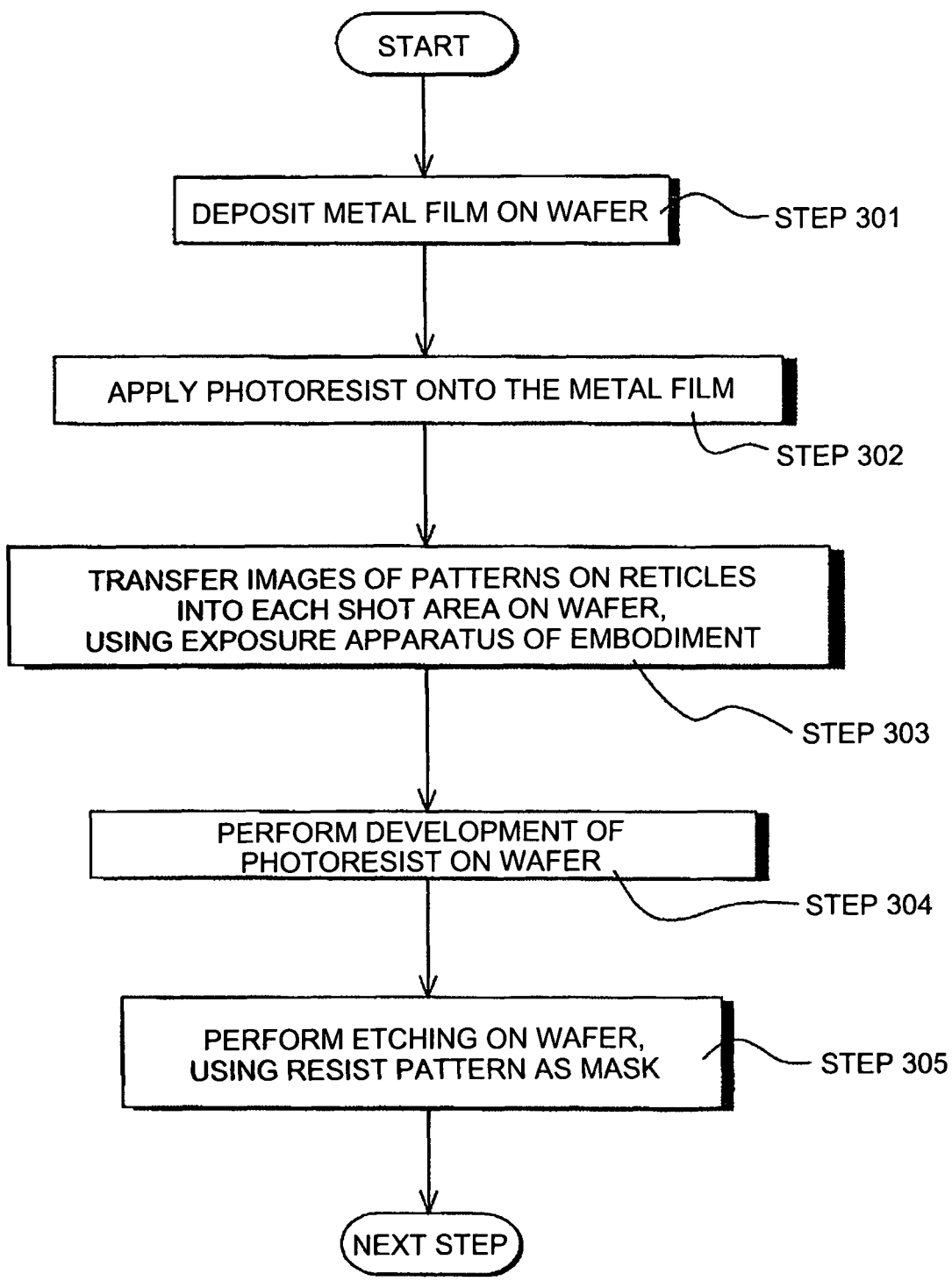
FIG. 26 is a flowchart of a technique of manufacturing semiconductor devices as micro devices.

The first step 301 in FIG. 26 is to deposit a metal film on each wafer in one lot. The next step 302 is to apply a photoresist onto the metal film on each wafer in the lot. The subsequent step 303 is to sequentially transfer images of patterns on masks into each shot area on each wafer in the lot through the projection optical system, using the exposure apparatus of the foregoing embodiments. The subsequent step 304 is to perform development of the photoresist on each wafer in the lot and the subsequent step 305 is to perform etching on each wafer in the lot, using the resist pattern as a mask, and thereby to form a circuit pattern corresponding to the patterns on the masks, in each shot area on each wafer.

Subsequent steps include formation of circuit patterns in upper layers, and others, thereby manufacturing devices such as semiconductor devices. The above-described semiconductor device manufacturing method permits us to obtain semiconductor devices with extremely fine circuit patterns at high throughput. The steps 301 to 305 were arranged to perform the steps of depositing the metal on the wafer, applying the resist onto the metal film, and performing each of the steps of exposure, development, and etching, but it is needless to mention that, prior to these steps, the method may include a process of first forming an oxide film of silicon on the wafer, then applying a resist onto the oxide film of silicon, and performing each of steps such as exposure, development, and etching.

Figure 27:
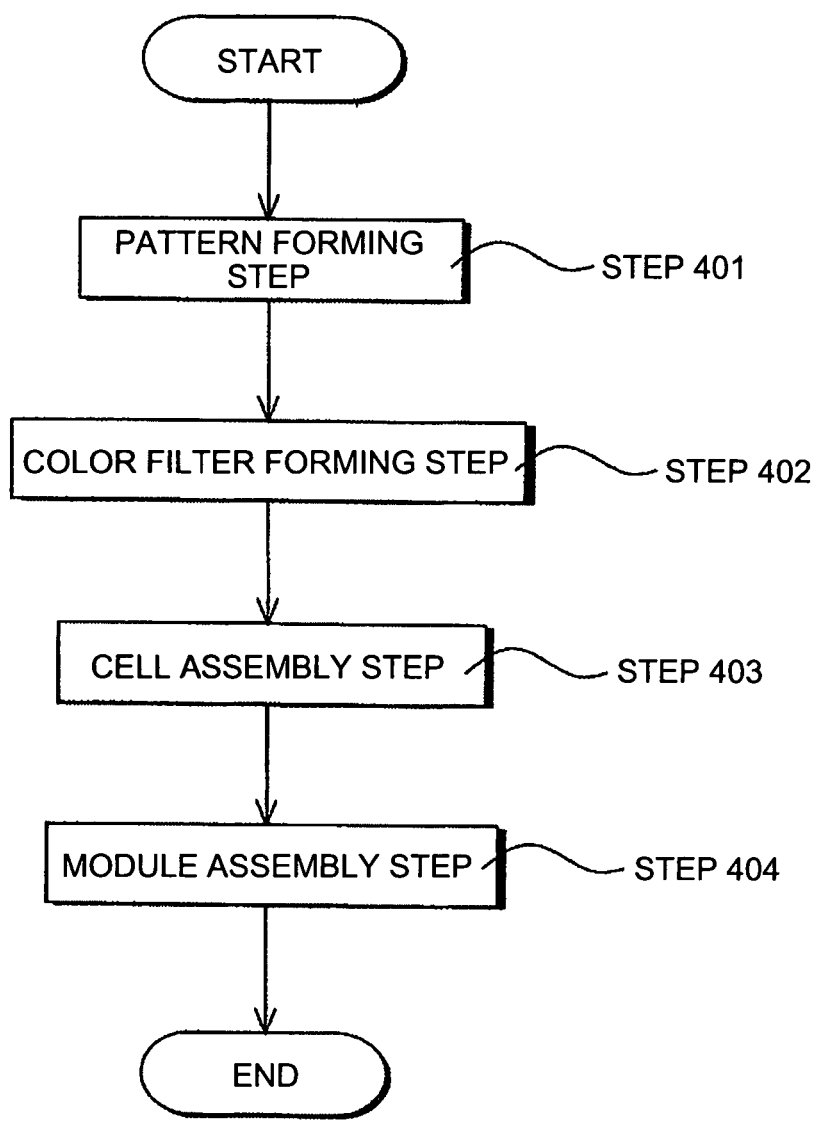
FIG. 27 is a flowchart of a technique of manufacturing a liquid-crystal display device as a micro device.

The exposure apparatus of the embodiments can also be used to manufacture a liquid-crystal display device as a micro device by forming predetermined patterns (circuit pattern, electrode pattern, etc.) on plates (glass substrates). An example of a technique in this case will be described with reference to the flowchart of FIG. 27. In FIG. 27, a pattern forming step 401 is to execute a so-called photolithography step to transfer patterns of masks onto a photosensitive substrate (glass substrate coated with a resist, or the like), using the exposure apparatus of the embodiments. This photolithography step results in forming the predetermined pattern including a number of electrodes and others on the photosensitive substrate. Thereafter, the exposed substrate is subjected to each of steps such as development, etching, and resist removal, whereby a predetermined pattern is formed on the substrate. Thereafter, the process shifts to the next color filter forming step 402.

The next color filter forming step 402 is to form a color filter in which a number of sets of three dots corresponding to R (Red), G (Green), and B (Blue) are arrayed in a matrix pattern, or in which sets of three stripe filters of R, G, and B are arrayed as a plurality of lines arranged in the horizontal scan line direction. After completion of the color filter forming step 402, a cell assembly step 403 is carried out. The cell assembly step 403 is to assemble a liquid crystal panel (liquid crystal cell), using the substrate with the predetermined pattern obtained in the pattern forming step 401, the color filter obtained in the color filter forming step 402, and so on.

In the cell assembly step 403, for example, a liquid crystal is poured into between the substrate with the predetermined pattern obtained in the pattern forming step 401 and the color filter obtained in the color filter forming step 402, to manufacture a liquid crystal panel (liquid crystal cell). The subsequent module assembly step 404 is to install each of components such as an electric circuit, a backlight, etc. for display operation of the assembled liquid crystal panel (liquid crystal cell) to complete the liquid-crystal display device. The above-described method of manufacturing the liquid-crystal display device permits us to obtain the liquid-crystal display device with an extremely fine circuit pattern at high throughput.

The above-described embodiments used the KrF excimer laser light source or the ArF excimer laser light source as the light source, but, without having to be limited to them, the foregoing embodiments and modifications are also applicable to the exposure apparatus using any other appropriate light source, e.g., an $F_2$ laser light source. Each of the aforementioned embodiments was explained using the example of the illumination optical apparatus mounted on the exposure apparatus and arranged to illuminate the masks, but it is apparent that the above embodiments can be applied to the general illumination optical apparatus for illuminating surfaces to be illuminated, except for the masks.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical apparatus comprising:
    an optical integrator comprising a plurality of lens elements including at least a first lens element and a second lens element;
    a beam splitting member comprising a first folding member and a second folding member, the first folding member being located at an illumination light path of the illumination optical apparatus and folding a light from the first lens element to emerge as a first light beam, the second folding member being located at a position different from that of the first folding member and folding a light from the second lens element to emerge as a second light beam, the beam splitting member being arranged for splitting an incident beam into the first light beam and the second light beam to form a first illumination region and a second illumination region;

a first light-guide optical system which is arranged in an optical path of the first light beam and which guides the first light beam to the first illumination region; and a second light-guide optical system which is arranged in an optical path of the second light beam and which guides the second light beam to the second illumination region located apart from the first illumination region, the second light-guide optical system being different from the first light-guide optical system.

2. The illumination optical apparatus according to claim 1, comprising a polarization varying member which is arrangeable in an optical path of the illumination optical apparatus and which varies a polarization state of at least one of the first light beam and the second light beam.

3. The illumination optical apparatus according to claim 2, wherein the polarization varying member is located near the beam splitting member.

4. The illumination optical apparatus according to claim 2, wherein the optical integrator includes a plurality of wavefront splitting regions, each of the first lens element and the second lens element being a wavefront splitting region, and the beam splitting member includes a plurality of folding members located so as to correspond to respective wavefront splitting regions of the optical integrator.

5. The illumination optical apparatus according to claim 2, wherein the optical integrator includes a plurality of wavefront splitting regions, each of the first lens element and the second lens element being a wavefront splitting region, and the polarization varying member includes a plurality of optical rotation members located so as to correspond to respective wavefront splitting regions of the optical integrator.

6. The illumination optical apparatus according to claim 2, further comprising an imaging optical system located behind the optical integrator, and arranged for forming the first light beam on the first illumination region and for forming the second light beam on the second illumination region;

wherein the beam splitting member is located at a position of a pupil of the imaging optical system or at a position near the pupil of the imaging optical system.

7. The illumination optical apparatus according to claim 6, wherein the beam splitting member includes the first folding member which folds a first portion of the incident beam to convert the first portion of the incident beam into the first light beam traveling along a first direction, and a light transmitting portion for transmitting a second portion of the incident beam without folding the second portion of the incident beam.

8. The illumination optical apparatus according to claim 7, wherein the polarization varying member includes an optical rotation member provided corresponding to the folding member.

9. The illumination optical apparatus according to claim 6, wherein the beam splitting member includes the first folding member which folds a first portion of the incident beam to convert the first portion of the incident beam into the first light beam traveling along a first direction, and the second folding member which folds a second portion of the incident beam to convert the second portion of the incident beam into the second light beam traveling along a second direction.

10. The illumination optical apparatus according to claim 9, wherein the polarization varying member includes an optical rotation member provided corresponding to at least one of the first folding member and the second folding member.

11. The illumination optical apparatus according to claim 1, comprising a common optical system which guides light from a light source to the beam splitting member.

12. The illumination optical apparatus according to claim 11, wherein the common optical system includes a variator which includes an ability to vary a first illumination condition in the first illumination region and a second illumination condition in the second illumination region.

13. An exposure apparatus comprising the illumination optical apparatus as set forth in claim 1, the exposure apparatus being arranged to effect exposure of predetermined patterns illuminated by the illumination optical apparatus, on a photosensitive substrate.

14. The exposure apparatus according to claim 13, comprising a projection optical system for projecting a pattern image of a first mask illuminated by the first illumination region and a pattern image of a second mask illuminated by the second illumination region, onto the photosensitive substrate.

15. The exposure apparatus according to claim 14, wherein the pattern image of the first mask illuminated by the first illumination region is effected in a first shot area on the photosensitive substrate, and the pattern image of the second mask illuminated by the second illumination region is effected in a second shot area on the photosensitive substrate.

16. A device manufacturing method comprising:

exposing the predetermined patterns on the photosensitive substrate using the exposure apparatus as set forth in claim 13;

developing the photosensitive substrate on which the predetermined pattern is transferred, and forming a mask layer in a shape corresponding to the predetermined pattern on a surface of the photosensitive substrate; and processing the surface of the photosensitive substrate through the mask layer.

17. The illumination optical apparatus according to claim 1, wherein the beam splitting member is located at a pupil position of the illumination optical apparatus.

18. The illumination optical apparatus according to claim 1, further comprising a common optical system including a condenser optical system, the beam splitting member being located in a position between the optical integrator and the condenser optical system.

19. The illumination optical apparatus according to claim 1, wherein the beam splitting member splits light beams divided by the optical integrator into the first light beam and the second light beam.

20. The illumination optical apparatus according to claim 1, wherein the optical integrator includes a plurality of wavefront splitting regions, each of the first lens element and the second lens element being a wavefront splitting region, and the beam splitting member is composed of a plurality of folding members arranged vertically and horizontally so that each folding member corresponds to respective wavefront splitting regions of the optical integrator.

21. The illumination optical apparatus according to claim 1, wherein in the beam spitting member, the first folding member is arranged in an optical path of the light from the first lens element and the second folding element is arranged in an optical path of the light from the second lens element.

22. An illumination optical apparatus comprising:

an optical integrator comprising a plurality of lens elements including at least a first lens element and a second lens element;

a beam splitting member comprising a first folding member and a second folding member, the first folding member being located at an illumination light path of the illumination optical apparatus and folding a light from the first lens element to emerge as a first light beam, the second folding member being located at a position different from that of the first folding member and folding a light from the second lens element to emerge as a second light beam, the beam splitting member being arranged in an optical path of an incident beam and which splits the incident beam into the first light beam and the second light beam to form a first illumination region and a second illumination region;
- a first light-guide optical system which is arranged in an optical path of the first light beam and which guides the first light beam to the first illumination region;
- a second light-guide optical system which is arranged in an optical path of the second light beam and which guides the second light beam to the second illumination region located apart from the first illumination region, the second light-guide optical system being different from the first light-guide optical system, and
- a common optical system which guides light from a light source to the beam splitting member;
- wherein the common optical system includes a variator which includes an ability to vary a first illumination condition in the first illumination region and a second illumination condition in the second illumination region; and
- a polarization variator which variably sets the first light beam in a desired polarization state in the first illumination region and variably sets the second light beam in a desired polarization state in the second illumination region, and the polarization variator is located in an incident side optical path of the variator or in an optical path between the variator and the beam splitting member.

23. An exposure apparatus comprising the illumination optical apparatus as set forth in claim 22, the exposure apparatus being arranged to effect exposure of predetermined patterns illuminated by the illumination optical apparatus, on a photosensitive substrate.

24. The exposure apparatus according to claim 23, comprising a projection optical system for projecting a pattern image of a first mask illuminated by the first illumination region and a pattern image of a second mask illuminated by the second illumination region, onto the photosensitive substrate.

25. The exposure apparatus according to claim 24, wherein the pattern image of the first mask illuminated by the first illumination region is effected in a first shot area on the photosensitive substrate, and the pattern image of the second mask illuminated by the second illumination region is effected in a second shot area on the photosensitive substrate.

26. A device manufacturing method comprising:
- exposing the predetermined patterns on the photosensitive substrate using the exposure apparatus as set forth in claim 23;
- developing the photosensitive substrate on which the predetermined pattern is transferred, and forming a mask layer in a shape corresponding to the predetermined pattern on a surface of the photosensitive substrate; and
- processing the surface of the photosensitive substrate through the mask layer.

27. The illumination optical apparatus according to claim 22, wherein in the beam spitting member, the first folding member is arranged in an optical path of the light from the first lens element and the second folding element is arranged in an optical path of the light from the second lens element.

28. An illumination optical apparatus comprising:
- an optical integrator comprising a plurality of lens elements including at least a first lens element and a second lens element;
- a beam splitting member comprising a first folding member and a second folding member, the first folding member being located at an illumination light path of the illumination optical apparatus and folding a light from the first lens element to emerge as a first light beam, the second folding member being located at a position different from that of the first folding member and folding a light from the second lens element to emerge as a second light beam, the beam splitting member being arranged in an optical path of an incident beam and which splits the incident beam into the first light beam and the second light beam to form a first illumination region and a second illumination region;
- a first light-guide optical system which is arranged in an optical path of the first light beam and which guides the first light beam to the first illumination region;
- a second light-guide optical system which is arranged in an optical path of the second light beam and which guides the second light beam to the second illumination region located apart from the first illumination region, the second light-guide optical system being different from the first light-guide optical system, and
- a setting member located in an incident side optical path of the beam splitting member and arranged for setting each of a first illumination condition in the first illumination region and a second illumination condition in the second illumination region
- wherein the setting member includes a polarization setting member which variably sets the first light beam in a first polarized illumination state in the first illumination region and variably sets the second light beam in the second polarized illumination state in the second illumination region.

29. The illumination optical apparatus according to claim 28 wherein the setting member includes a varying member which includes an ability to vary each of the first illumination condition in the first illumination region and the second illumination condition in the second illumination region.

30. The illumination optical apparatus according to claim 28, wherein the setting member changes a light intensity distribution on an illumination pupil to change an illumination condition in the first illumination region and to change an illumination condition in the second illumination region.

31. The illumination optical apparatus according to claim 30, wherein the setting member includes a diffractive optical element which diffracts incident light to form a desired light intensity distribution on the illumination pupil, and a power-varying optical system which varies the light intensity distribution on the illumination pupil.

32. The illumination optical apparatus according to claim 28, wherein the setting member includes a polarizing member located on the light source side and in proximity of the beam splitting member.

33. The illumination optical apparatus according to claim 28, wherein the beam splitting member is located at or near an illumination pupil.

34. An exposure apparatus comprising the illumination optical apparatus as set forth in claim 28, the exposure apparatus being arranged to effect exposure of predetermined patterns illuminated by the illumination optical apparatus, on a photosensitive substrate.

35. The exposure apparatus according to claim 34, comprising a projection optical system for projecting a pattern image of a first mask illuminated by the first illumination region and a pattern image of a second mask illuminated by the second illumination region, onto the photosensitive substrate.

36. The exposure apparatus according to claim 35, wherein the pattern image of the first mask illuminated by the first illumination region is effected in a first shot area on the photosensitive substrate, and the pattern image of the second mask illuminated by the second illumination region is effected in a second shot area on the photosensitive substrate.

37. A device manufacturing method comprising:
exposing the predetermined patterns on the photosensitive substrate using the exposure apparatus as set forth in claim 34;
developing the photosensitive substrate on which the predetermined pattern is transferred, and forming a mask layer in a shape corresponding to the predetermined pattern on a surface of the photosensitive substrate; and
processing the surface of the photosensitive substrate through the mask layer.

38. The illumination optical apparatus according to claim 28, wherein in the beam spitting member, the first folding member is arranged in an optical path of the light from the first lens element and the second folding element is arranged in an optical path of the light from the second lens element.

39. An exposure apparatus comprising:
an illumination optical system for distributing light from a light source on an illumination pupil plane to illuminate a plane to be illuminated with light from the illumination pupil plane; and
a projection optical system for forming a pattern image on a substrate arranged on the plane to be illuminated,
wherein the illumination optical system comprises:
a beam splitting member having a first folding member which is arranged in an illumination light path of the illumination optical system and which folds a part of the light from the illumination pupil plane into a first direction and a second folding member which is arranged in the illumination light path of the illumination optical system and which folds a part of the light from the illumination pupil plane into a second direction; and
a light-guide optical system which is arranged in the illumination light path of the illumination optical system and which guides a first light beam folded into the first direction on a first illumination region on the plane to be illuminated and guides a second light beam folded into the second direction on a second illumination region on the plane to be illuminated and different from the first illumination region.

40. The exposure apparatus according to claim 39, wherein a first pupil distribution associated with the first light beam guided to the first illumination region is different from a second pupil distribution associated with the second light beam guided to the second illumination region.

41. The exposure apparatus according to claim 40, further comprising a fly's eye lens in which a plurality of optical surfaces are arranged in parallel,
wherein the first and second folding members are located near an exit surface of the fly's eye lens or a plane optically conjugated with the exit surface of the fly's eye lens.

42. The exposure apparatus according claim 39, wherein the first and second folding members are arranged near the illumination pupil or a position optically conjugated with the illumination pupil.

43. The exposure apparatus according to claim 42, wherein the first and second folding members are arranged at different positions in a plane near the illumination pupil plane or a plane optically conjugated with the illumination pupil.

44. The exposure apparatus according to claim 39, further comprising an optical system for distributing the light from the light source at different positions on the illumination pupil plane.

45. The exposure apparatus according to claim 44, wherein the first and second folding members are arranged at the different postions respectively.

* * * * *